(12) United States Patent
Seo et al.

(10) Patent No.: US 11,398,499 B2
(45) Date of Patent: *Jul. 26, 2022

(54) SEMICONDUCTOR DEVICE INCLUDING A GATE PITCH AND AN INTERCONNECTION LINE PITCH AND A METHOD FOR MANUFACTURING THE SAME

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Jae-Woo Seo, Seoul (KR); Youngsoo Shin, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 156 days.

This patent is subject to a terminal disclaimer.

(21) Appl. No.: 16/791,964

(22) Filed: Feb. 14, 2020

(65) Prior Publication Data
US 2020/0185414 A1 Jun. 11, 2020

Related U.S. Application Data

(63) Continuation of application No. 15/908,253, filed on Feb. 28, 2018, now Pat. No. 10,593,701.

(30) Foreign Application Priority Data

Mar. 2, 2017 (KR) .................. 10-2017-0027209
Aug. 4, 2017 (KR) .................. 10-2017-0099161

(51) Int. Cl.
*H01L 27/118* (2006.01)
*H01L 23/528* (2006.01)
(Continued)

(52) U.S. Cl.
CPC ...... *H01L 27/11807* (2013.01); *G06F 30/394* (2020.01); *H01L 23/528* (2013.01); *H01L 27/0207* (2013.01); *H01L 2027/11887* (2013.01)

(58) Field of Classification Search
CPC .............. H01L 27/0207; H01L 23/528; H01L 2027/11887; H01L 27/11807; G06F 17/5077
See application file for complete search history.

(56) References Cited

U.S. PATENT DOCUMENTS 8,174,052 B2 5/2012 Kim et al.
8,788,998 B2 7/2014 Hatamian et al.
(Continued)

FOREIGN PATENT DOCUMENTS

KR 10-2016-0105263 9/2016

*Primary Examiner* — Nelson Garces
(74) *Attorney, Agent, or Firm* — F. Chau & Associates, LLC

(57) ABSTRACT

A semiconductor device includes a substrate including a PMOSFET region and an NMOSFET region. First active patterns are on the PMOSFET region. Second active patterns are on the NMOSFET region. Gate electrodes intersect the first and second active patterns and extend in a first direction. First interconnection lines are disposed on the gate electrodes and extend in the first direction. The gate electrodes are arranged at a first pitch in a second direction intersecting the first direction. The first interconnection lines are arranged at a second pitch in the second direction. The second pitch is smaller than the first pitch.

20 Claims, 34 Drawing Sheets

(51) Int. Cl.
    *G06F 17/50*     (2006.01)
    *H01L 27/02*     (2006.01)
    *G06F 30/394*     (2020.01)

(56) References Cited

U.S. PATENT DOCUMENTS

| | | | |
|---|---|---|---|
| 8,949,749 B2 | 2/2015 | Wang et al. | |
| 9,454,633 B2 | 9/2016 | Frederick, Jr. | |
| 10,593,701 B2* | 3/2020 | Seo | H01L 27/0207 |
| 2010/0308410 A1 | 12/2010 | Ostermayr et al. | |
| 2013/0187235 A1* | 7/2013 | Huang | H01L 21/823828 |
| | | | 257/369 |
| 2015/0333008 A1 | 11/2015 | Gupta et al. | |
| 2015/0371959 A1 | 12/2015 | Frederick, Jr. et al. | |
| 2016/0254256 A1* | 9/2016 | Baek | H01L 23/5283 |
| | | | 257/401 |
| 2016/0342726 A1 | 11/2016 | Yuan et al. | |
| 2018/0175060 A1 | 6/2018 | Zhu et al. | |
| 2018/0254287 A1 | 9/2018 | Seo et al. | |

\* cited by examiner

SEMICONDUCTOR DEVICE INCLUDING A GATE PITCH AND AN INTERCONNECTION LINE PITCH AND A METHOD FOR MANUFACTURING THE SAME

CROSS-REFERENCE TO RELATED APPLICATIONS

This U.S. non-provisional patent application claims priority under 35 U.S.C. § 120 to U.S. patent application Ser. No. 15/908,253, filed on Feb. 28, 2018, which claims priority under 35 U.S.C. § 119 to Korean Patent Application Nos. 10-2017-0027209, filed on Mar. 2, 2017, and 10-2017-0099161, filed on Aug. 4, 2017, in the Korean Intellectual Property Office, the disclosures of which are incorporated by reference herein in their entireties.

TECHNICAL FIELD

Exemplary embodiments of the present inventive concept relate to a semiconductor device including a gate pitch and an interconnection line pitch and a method for manufacturing the same.

DISCUSSION OF RELATED ART

Semiconductor devices are widely used in electronics industries. Semiconductor devices may have relatively small sizes, multi-functional characteristics, and/or relatively low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices with increased reliability and relatively low error rates have been increasingly demanded with developments in electronics industries. For example, high-reliable, high-speed, and/or multi-functional semiconductor devices have been increasingly demanded. Thus, semiconductor devices have been become increasingly integrated.

SUMMARY

An exemplary embodiment of the present inventive concept provides a semiconductor device including a field effect transistor, which is capable of increasing an integration density of the semiconductor device.

An exemplary embodiment of the present inventive concept provides a method for manufacturing a semiconductor device including a field effect transistor, which is capable of increasing an integration density of the semiconductor device.

An exemplary embodiment of the present inventive concept provides, a semiconductor device including a substrate including a PMOSFET region and an NMOSFET region. First active patterns are on the PMOSFET region. Second active patterns are on the NMOSFET region. Gate electrodes intersect the first and second active patterns and extend in a first direction. First interconnection lines are disposed on the gate electrodes and extend in the first direction. The gate electrodes are arranged at a first pitch in a second direction intersecting the first direction. The first interconnection lines are arranged at a second pitch in the second direction. The second pitch is smaller than the first pitch.

An exemplary embodiment of the present inventive concept provides, a semiconductor device including a first logic cell and a second logic cell on a substrate. A structure of a logic circuit of the first logic cell is the same as a structure of a logic circuit of the second logic cell. Each of the first and second logic cells include a gate electrode intersecting a PMOSFET region and an NMOSFET region of the substrate and extending in a first direction. An internal interconnection line is disposed on the gate electrode and extends in the first direction. The internal interconnection line is an interconnection line included in the logic circuit of each of the first and second logic cells. A distance by which an internal interconnection line of the first logic cell is offset from a gate electrode of the first logic cell in a plan view is different from a distance by which an internal interconnection line of the second logic cell is offset from a gate electrode of the second logic cell in a plan view.

An exemplary embodiment of the present inventive concept provides, a method for manufacturing a semiconductor device including designing a layout of a semiconductor device, and forming patterns on a substrate by using the layout. The designing of the layout includes placing standard cells, realigning an internal interconnection line pattern in at least one of the standard cells with at least one of interconnection line pattern tracks. The designing of the layout includes routing the standard cells to place routing patterns aligned with the interconnection line pattern tracks.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

Figure 1:
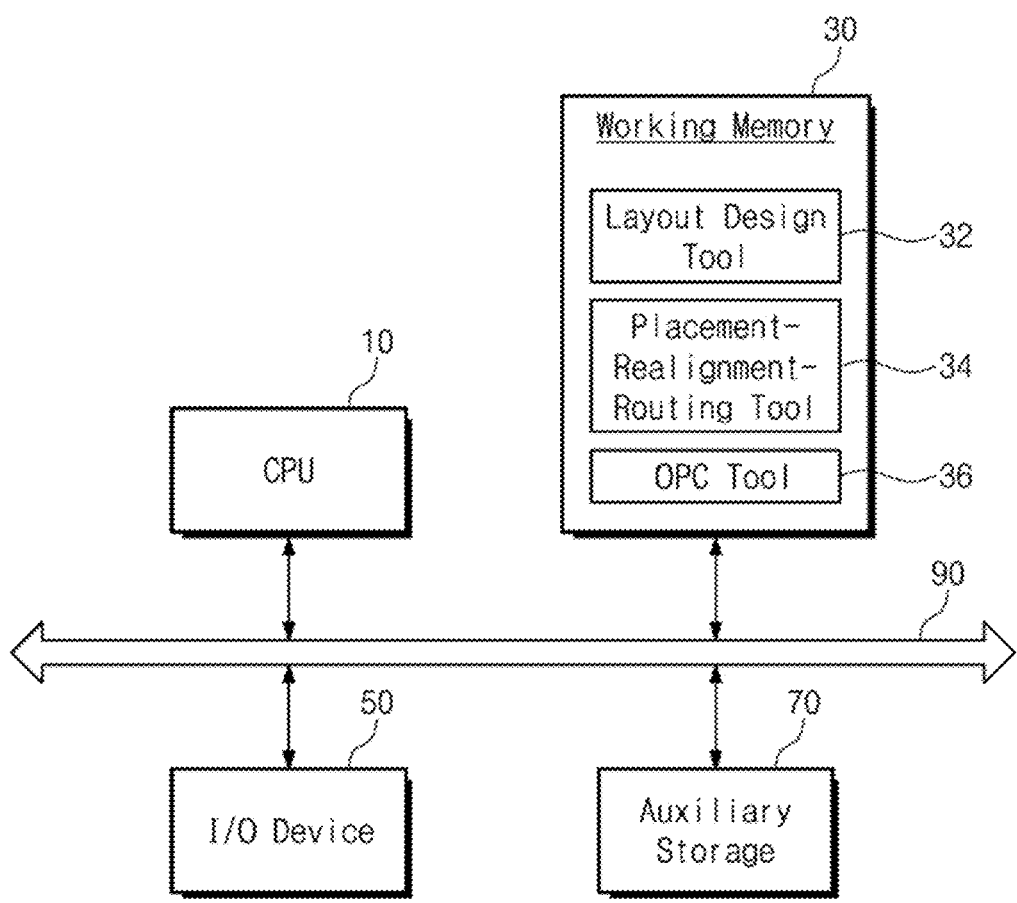
FIG. 1 is a schematic block diagram illustrating a computer system for performing a semiconductor design process, according to an exemplary embodiment of the present inventive concept.

FIG. 1 is a schematic block diagram illustrating a computer system for performing a semiconductor design process, according to an exemplary embodiment of the present inventive concept.

Referring to FIG. 1, a computer system may include a central processing unit (CPU) 10, a working memory 30, an input/output (I/O) device 50, and an auxiliary storage device 70. In an exemplary embodiment of the present inventive concept, the computer system may be a customized system for performing a layout design process according to an exemplary embodiment of the present inventive concept. In addition, the computer system may include and execute various design and verification simulation programs.

The CPU 10 may execute a variety of software (e.g., application programs, an operating system, and device drivers) in the computer system. The CPU 10 may execute the operating system loaded in the working memory 30. In addition, the CPU 10 may execute various application programs driven based on the operating system. For example, the CPU 10 may execute a layout design tool 32, a placement-realignment-routing tool 34 and/or an OPC tool 36 loaded in the working memory 30. The execution of the layout design tool 32, the placement-realignment-routing tool 34 and/or the OPC tool 36 may increase the operating efficiency and accuracy of the CPU 10 to design and manufacture a semiconductor device with a decreased error or defect rate, thus increasing manufacturing yield and cost efficiency.

The operating system and/or the application programs may be loaded in the working memory 30. For example, when the computer system starts a booting operation, an image of the operating system stored in the auxiliary storage device 70 may be loaded in the working memory 30 on the basis of a booting sequence. Overall input/output operations of the computer system may be managed by the operating system. Similarly, the application programs, which may be selected by a user or be provided for basic services, may be loaded in the working memory 30.

The layout design tool 32 for the layout design process may be loaded from the auxiliary storage device 70 into the working memory 30. The placement-realignment-routing tool 34 may be loaded from the auxiliary storage device 70 into the working memory 30. The placement-realignment-routing tool 34 may place designed standard cells, may realign internal interconnection line patterns in the placed standard cells, and may route the placed standard cells. The OPC tool 36 of performing optical proximity correction (OPC) on designed layout data may be loaded from the auxiliary storage device 70 into the working memory 30.

The layout design tool 32 may have a bias function for changing or modifying shapes and positions, defined by a resign rule, of specific layout patterns. The layout design tool 32 may perform a design rule check (DRC) under a bias data condition modified by the bias function. The working memory 30 may include at least one of a volatile memory device (e.g., a static random access memory (SRAM) device or a dynamic random access memory (DRAM) device) or a non-volatile memory device (e.g., a PRAM device, a MRAM device, a ReRAM device, a FRAM device, or a NOR flash memory device).

The I/O device 50 may control input and output operations of a user through user interface devices. For example, the I/O device 50 may include a keyboard and/or a monitor and may receive relevant information from a designer. By using the I/O device 50, the designer may receive information on semiconductor regions or data paths which include adjusted operating characteristics. In addition, a process and processed results of the OPC tool 36 may be displayed through the I/O device 50.

The auxiliary storage device 70 may serve as a storage medium of the computer system. The auxiliary storage device 70 may store the application programs, the image of the operating system, and various data. The auxiliary storage device 70 may be provided in the form of at least one of a memory card (e.g., MMC, eMMC, SD, or Micro SD) or a hard disk drive (HDD). In an exemplary embodiment of the present inventive concept, the auxiliary storage device 70 may include a NAND-type flash memory device having a large storage capacity. Alternatively, the auxiliary storage device 70 may include at least one of next-generation non-volatile memory devices (e.g., PRAM, MRAM, ReRAM, or FRAM) or NOR flash memory devices.

A system interconnector 90 may serve as a system bus for providing a network in the computer system. The CPU 10, the working memory 30, the I/O device 50, and the auxiliary storage device 70 may be electrically connected to each other through the system interconnector 90, and data may be exchanged therebetween through the system interconnector 90. However, the system interconnector 90 is not particularly limited to the aforementioned configuration. In an exemplary embodiment of the present inventive concept, the system interconnector 90 may further include an additional element for increasing efficiency in data communication.

Figure 2:
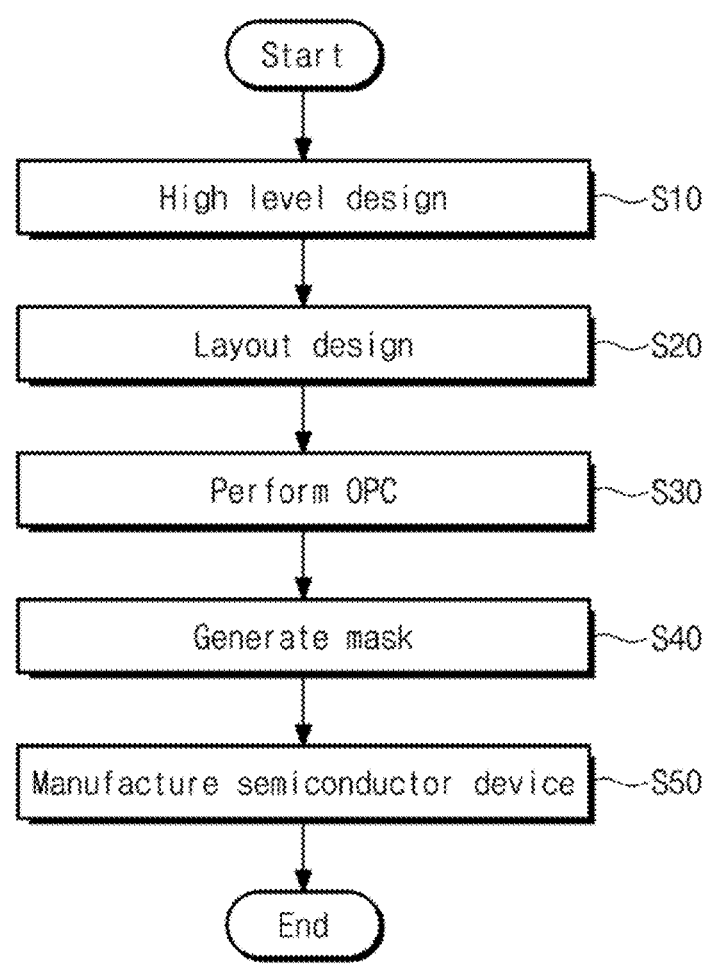
FIG. 2 is a flowchart illustrating a method for designing and manufacturing a semiconductor device, according to an exemplary embodiment of the present inventive concept.

FIG. 2 is a flowchart illustrating a method for designing and manufacturing a semiconductor device, according to an exemplary embodiment of the present inventive concept.

Referring to FIG. 2, a high-level design (S10) process of a semiconductor integrated circuit may be performed using the computer system described in more detail above with reference to FIG. 1. The high-level design process may mean that an integrated circuit to be designed is described with a high-level computer language. For example, the high-level computer language may be a C language. Circuits designed by the high-level design process may be more specifically described by a register transfer level (RTL) coding or simulation. In addition, codes generated by the RTL coding may be converted into netlists, and the netlists may be combined with each other to design an entire semiconductor device. The combined schematic circuit may be verified by a simulation tool. In an exemplary embodiment of the present inventive concept, an adjusting operation may further be performed depending on results of the verification.

A layout design (S20) process may be performed to design a logically completed semiconductor integrated circuit on a silicon substrate. For example, the layout design process may be performed based on the schematic circuit prepared in the high-level design process or the netlist corresponding thereto. The layout design process may include operations of placing and routing (e.g., connecting) various standard cells that are provided from a cell library based on a predetermined design rule.

The cell library for the layout design process may also include information on operations, speeds and power consumption of the standard cells. In an exemplary embodiment of the present inventive concept, the cell library for representing a layout of a circuit having a specific gate level may be defined in most of layout design tools. The layout of the circuit may define or describe shapes and/or sizes of patterns of transistors and metal interconnection lines which will be actually formed on a silicon substrate. For example, layout patterns (e.g., PMOS, NMOS, N-WELL, gate electrodes, and metal interconnection lines to be disposed thereon) may be suitably placed to actually form an inverter circuit on a silicon substrate. For this, first, suitable one of inverters defined in advance in the cell library may be searched and selected.

The routing operation may be performed on the selected and placed standard cells. As an example, upper interconnection lines (i.e., routing patterns) may be placed on the placed standard cells. The placed standard cells may be connected to each other by the routing operation to fit the design. The placement and routing of the standard cells may be automatically performed by the placement-realignment-routing tool 34.

After the routing operation, a verification operation may be performed on the layout to verify whether there is a portion violating the design rule. In an exemplary embodiment of the present inventive concept, the verification operation may include evaluating verification items, such as a design rule check (DRC) item, an electrical rule check (ERC) item, and a layout vs schematic (LVS) item. The DRC item may be performed to check whether the layout meets the design rule (e.g., within predetermined quality standards). The ERC item may be performed to check whether there is an issue of electrical disconnection in the layout. The LVS item may be performed to check whether the layout is prepared to coincide with the gate-level netlist.

An optical proximity correction (OPC) process may be performed (S30). The layout patterns obtained by the layout design process may be realized on a silicon substrate by a photolithography process. The OPC process may be performed to correct an optical proximity effect which may occur in the photolithography process. The optical proximity effect may be an unintended optical effect (e.g., such as refraction or diffraction) which may occur in the photolithography process. Thus, a distortion phenomenon of layout patterns, which may be caused by the optical proximity effect, may be corrected by the OPC process. The shapes and positions of the designed layout patterns may be slightly modified or biased by the OPC process.

A photomask may be generated (S40) based on the layout modified or biased by the OPC process. In general, the photomask may be generated by patterning a chromium layer, deposited on a glass substrate, by using the layout pattern data.

A semiconductor device may be manufactured (S50) using the generated photomask. Various exposure and etching processes may be repeated in the manufacture of the semiconductor device using the photomasks. By these processes, shapes of patterns obtained in the layout design process may be sequentially formed on a silicon substrate.

Figure 3:
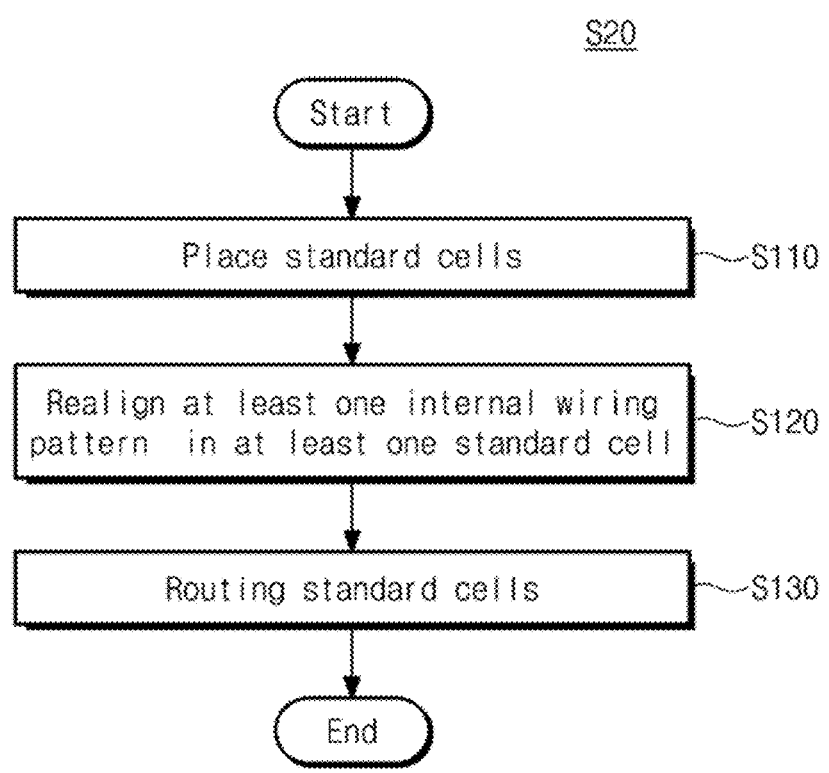
FIG. 3 is a flowchart illustrating operations of placing and routing standard cells according to an exemplary embodiment of the present inventive concept in the operation of performing a layout design process in FIG. 2.
Figure 4:
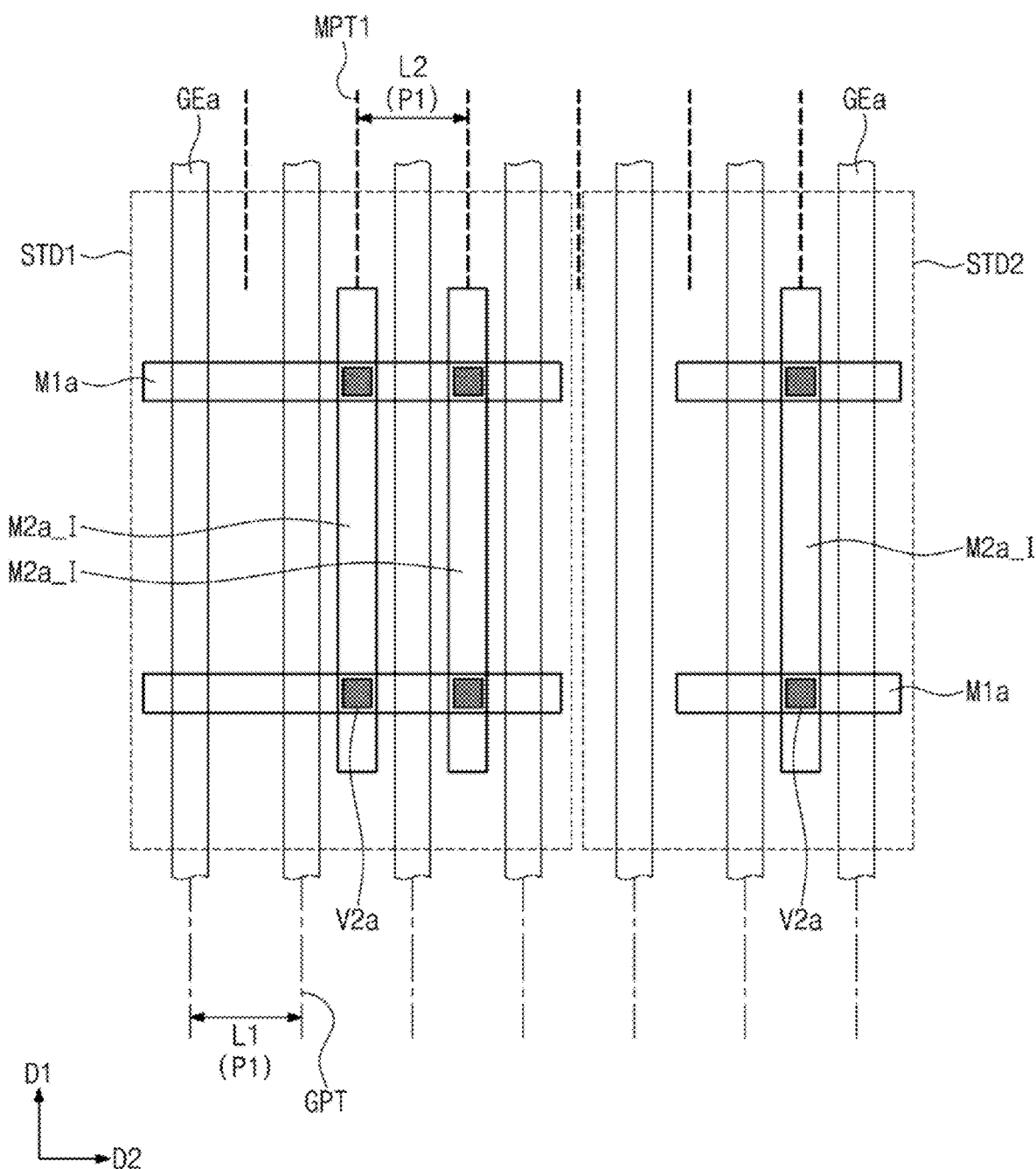
FIGS. 4 to 6 are each layouts according to an exemplary embodiment of the present inventive concept in the operation of placing and routing the standard cells in FIG. 3.
Figure 5:
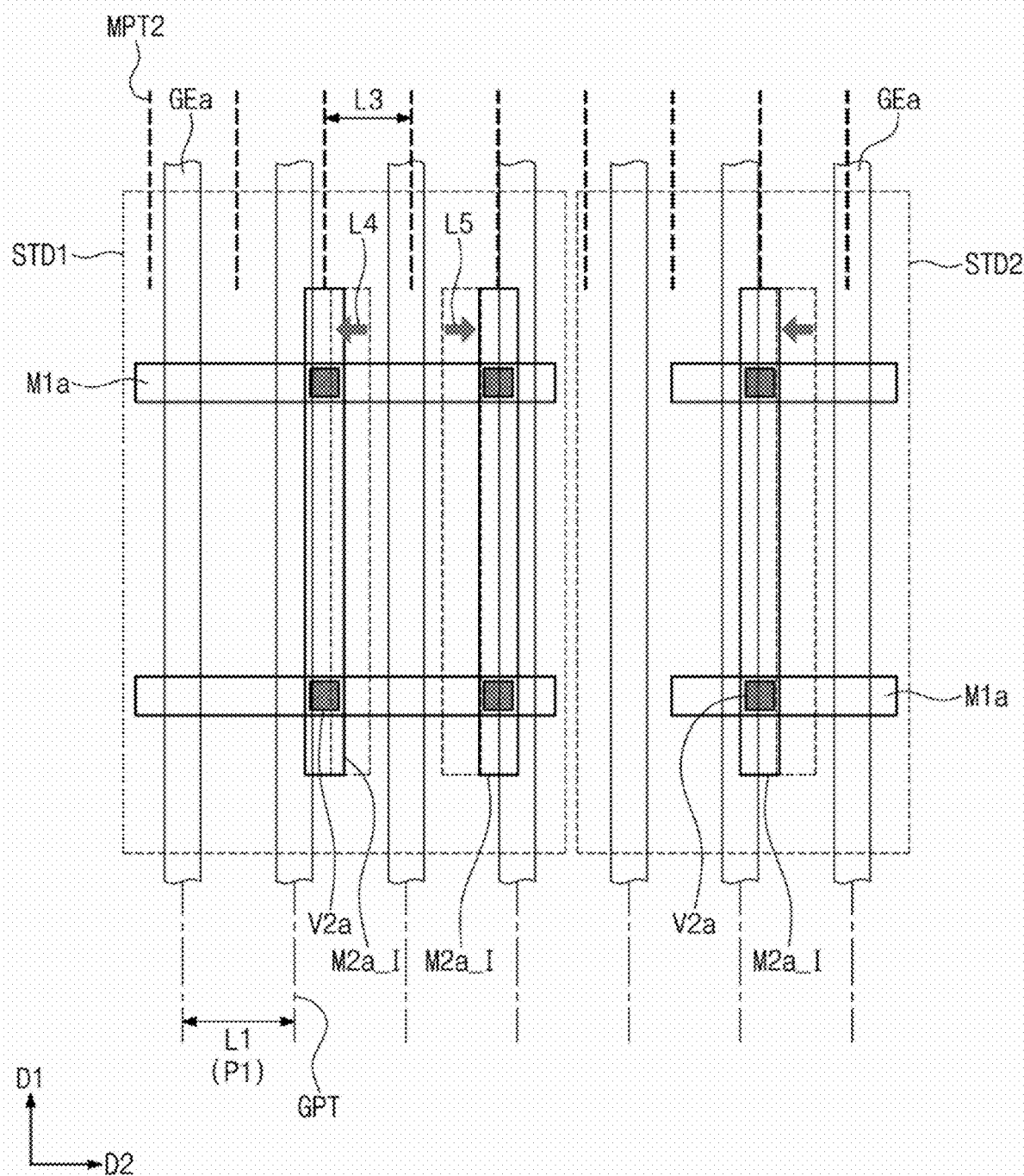
Figure 6:
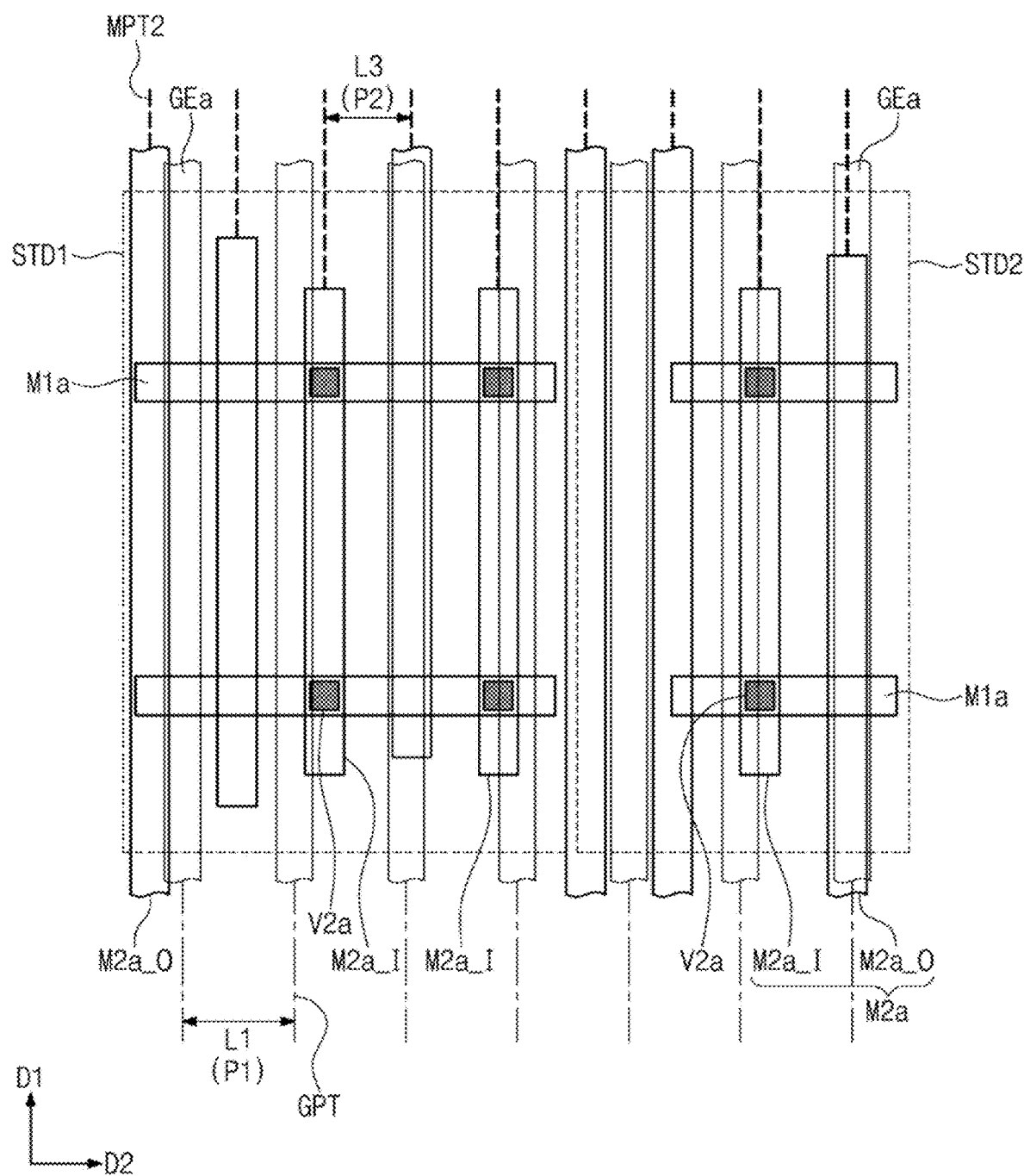

FIG. 3 is a flowchart illustrating operations of placing and routing standard cells according to an exemplary embodiment of the present inventive concept in the operation of performing the layout design process in FIG. 2. FIGS. 4 to 6 are each layouts according to an exemplary embodiment of the present inventive concept in the operation of placing and routing the standard cells in FIG. 3. The layout design (S20) described above with reference to FIG. 2 is described in more detail below with reference to FIG. 3, and with reference to FIGS. 4-6.

Referring to FIGS. 3 and 4, a first standard cell STD1 and a second standard cell STD2 may be placed (S110). The first standard cell STD1 and the second standard cell STD2 may be arranged in a second direction D2. For example, the first standard cell STD1 and the second standard cell STD2 may each extend in the first direction D1 and may be spaced part from each other along the second direction D2. A function of the first standard cell STD1 may be different from that of the second standard cell STD2. As an example, a logic circuit of the first standard cell STD1 may be different from a logic circuit of the second standard cell STD2.

The first and second standard cells STD1 and STD2 may each include gate patterns GEa, first interconnection line patterns M1a, internal interconnection line patterns M2a_I, and via patterns V2a. In addition, the first and second standard cells STD1 and STD2 may include other layout patterns (e.g., active patterns, active contact patterns, and/or gate contact patterns). The other layout patterns (e.g., the active patterns, the active contact patterns, and/or the gate contact patterns) may be omitted in the first and second standard cells STD1 and STD2 illustrated in FIGS. 4 to 6 for clarity of description; however, the other layout patterns may be included in the first and second standard cells STD1 and STD2.

The gate patterns GEa may extend in a first direction D1 and may be arranged in the second direction D2 intersecting (e.g., being perpendicular to) the first direction D1. For example, each of the gate patterns GEa may extend in the first direction D1 while being spaced apart from each other along the second direction D2. The gate patterns GEa may define gate electrodes. The gate patterns GEa may be aligned with gate pattern tracks GPT (e.g., along the first direction D1). The gate pattern tracks GPT may be set lines that are used to place the gate patterns GEa in the standard cell. A central line of each of the gate patterns GEa may overlap with a corresponding one of the gate pattern tracks GPT (e.g., along a direction orthogonal to the first and second directions D1 and D2). The central line may be an imaginary line that passes through a center of the gate pattern GEa and extends in a longitudinal direction (e.g., the first direction D1) of the gate pattern GEa. A distance between a pair of the gate pattern tracks GPT adjacent to each other may be a first distance L1. As an example, the minimum distance between the gate pattern tracks GPT may be the first distance L1. The gate pattern tracks GPT may be arranged in the second direction D2 at equal distances L1. The minimum pitch between the gate patterns GEa may be a first pitch P1, and the first pitch P1 may be equal to the first distance L1. Herein, the term(s) "pitch" and/or "minimum pitch" may refer to a sum of a distance between a pair of adjacent patterns and a width of one of the patterns.

The first interconnection line patterns M1a may be located at a higher level than the gate patterns GEa. The first interconnection line patterns M1a may define a first metal layer (e.g., first interconnection lines). The first interconnection line patterns M1a may extend in the second direction D2.

The internal interconnection line patterns M2a_I may be located at a higher level than the first interconnection line patterns M1a. The internal interconnection line patterns M2a_I may define a second metal layer (e.g., second interconnection lines). The internal interconnection line patterns M2a_I may extend in the first direction D1. The internal interconnection line patterns M2a_I may be substantially parallel to the gate patterns GEa.

The via patterns V2a may be placed in regions in which the first interconnection line patterns M1a overlap with the internal interconnection line patterns M2a_I (e.g., along a direction orthogonal to the first and second directions D1 and D2). The via patterns V2a may define vias that vertically connect the first interconnection lines (e.g., the first interconnection line patterns M1a_I) to the second interconnection lines (e.g., the internal interconnection line patterns M2a_I). For example, the via patterns V2a and the internal interconnection line patterns M2a_I may be formed into the second metal layer.

The internal interconnection line patterns M2a_I placed in the first and second standard cells STD1 and STD2 (see, e.g., FIG. 4) may define interconnection lines for forming the logic circuits of the first and second standard cells STD1 and STD2. For example, the internal interconnection line patterns M2a_I may define interconnection lines functioning as output nodes or input nodes of the logic circuits of the first and second standard cells STD1 and STD2.

The internal interconnection line patterns M2a_I may be aligned with first interconnection line pattern tracks MPT1. For example, the internal interconnection line patterns M2a_I may be aligned with first interconnection line pattern tracks MPT1 along the first direction D1. The first interconnection line pattern tracks MPT1 may be set lines that are used to place the internal interconnection line patterns M2a_I in the standard cell. A central line of each of the internal interconnection line patterns M2a_I may overlap with a corresponding one of the first interconnection line pattern tracks MPT1 (e.g., along the first direction D1). The central line may be an imaginary line that passes through a center of the internal interconnection line pattern M2a_I and extends in a longitudinal direction (e.g., the first direction D1) of the internal interconnection line pattern M2a_I. A distance between a pair of the first interconnection line pattern tracks MPT1 adjacent to each other may be a second distance L2. As an example, the minimum distance between the central lines of the internal interconnection line patterns M2a_I may be the second distance L2. The second distance L2 may be substantially equal to the first distance L1 described above. The minimum pitch between the internal interconnection line patterns M2a_I may be equal to the minimum pitch (e.g., the first pitch P1) between the gate patterns GEa. A distance between the central lines of the internal interconnection line patterns M2a_I may be n×P1 where "n" is an integral number equal to or greater than 1. For example, a distance between the central line of a first internal interconnection line pattern M2a_I and the central line of a second internal interconnection line pattern M2a_I may be 1×P in the first standard cell STD1. A distance between the central line of the second internal interconnection line pattern M2a_I of the first standard cell STD1 and the central line of the internal interconnection line pattern M2a_I of the second standard cell STD2 may be 3×P1.

The first and second standard cells STD1 and STD2 may be placed based on the first pitch P1 corresponding to a gate pitch. An integration density of a semiconductor device may be increased as the first pitch P of the gate pitch decreases. As an example, the integration density of the semiconductor device may be increased without increasing (e.g., while decreasing) an occurrence of defects in the semiconductor device. The minimum value of the first pitch P1 may be determined depending on the minimum width realized by processes for manufacturing a semiconductor device.

Referring to FIGS. 3 and 5, at least one internal wiring pattern in at least one standard cell may be realigned (S120). For example, at least one internal interconnection line pattern M2a_I in at least one of the first and second standard cells STD1 and STD2 may be realigned. After the first and second standard cells STD1 and STD2 are placed, new second interconnection line pattern tracks MPT2 may be set instead of the first interconnection line pattern tracks MPT1 which are preset. The second interconnection line pattern tracks MPT2 may be set lines that are used to place routing patterns M2a_O in a subsequent routing operation (see, e.g., FIG. 6). Thus, the standard cells may be routed (S130). A distance between a pair of the second interconnection line pattern tracks MPT2 adjacent to each other may be a third distance L3. The third distance L3 may be smaller than the second distance L12 (or the first distance L1).

The internal interconnection line patterns M2a_I in the first and second standard cells STD1 and STD2 may be realigned with the second interconnection line pattern tracks MPT2. Each of the internal interconnection line patterns M2a_I may be realigned with the second interconnection line pattern track MPT2 closest thereto. The central line of each of the internal interconnection line patterns M2a_I may overlap with a corresponding one of the second interconnection line pattern tracks MPT2 (e.g., along a direction orthogonal to the first and second directions D1 and D2).

In the realigning operation (S120), the internal interconnection line patterns M2a_I may be laterally moved in parallel to the second direction D2. In the realigning operation (S120), movement distances and movement directions of the internal interconnection line patterns M2a_I may be the same as or different from each other. For example, the first internal interconnection line pattern M2a_I of the first standard cell STD1 may be moved in a direction opposite to the second direction D2 by a fourth distance L4, and the second internal interconnection line pattern M2a_I of the first standard cell STD1 may be moved in the second direction D2 by a fifth distance L5 greater than the fourth distance L4. A distance between the central lines of the realigned internal interconnection line patterns M2a_I may be different from the distance (n×P1) between the central lines of the internal interconnection line patterns M2a_I before the realigning operation (S120).

The via patterns V2a may also be realigned with the second interconnection line pattern tracks MPT2, along with the internal interconnection line patterns M2a_I. As an example, the via pattern V2a may be moved together with the internal interconnection line pattern M2a_I corresponding thereto.

Referring to FIGS. 3 and 6, an operation of routing the standard cells may be performed (S130). The operation of routing the standard cells may include placing routing patterns M2a_O. By the placement of the routing patterns M2a_O, the standard cells may be connected to each other to meet a designed circuit.

The routing patterns M2a_O may be located at the same level as the internal interconnection line patterns M2a_I. The routing patterns M2a_O and the internal interconnection line patterns M2a_I may be defined as second interconnection line patterns M2a. The second interconnection line patterns M2a may define the second metal layer. The routing patterns M2a_O may be aligned with the second interconnection line pattern tracks MPT2 (e.g., along the first direction D1). A central line of each of the routing patterns M2a_O may overlap with a corresponding one of the second interconnection line pattern tracks MPT2 (e.g., along a direction orthogonal to the first and second directions D1 and D2). Routing patterns located at a higher level than the second interconnection line patterns M2a may also be placed in the routing operation (S130).

The minimum pitch between the second interconnection line patterns M2a may be the second pitch P2 equal to the third distance L3. The second pitch P2 may be smaller than the first pitch P1. A distance between the central lines of the second interconnection line patterns M2a may be n×P2 where "n" is an integral number equal to or greater than 1.

When the placement and routing of the standard cells (see, e.g., FIG. 3) are completed, the OPC process may be performed on the designed layout, and photomasks may be generated. Semiconductor processes may be performed using the generated photomasks to manufacture a semiconductor device (see, e.g., FIG. 1).

The method of placing and routing the standard cells according to an exemplary embodiment of the present inventive concept may include the operation of realigning the internal interconnection line patterns M2a_I in such a way that the internal interconnection line patterns M2a_I meet the placement distance (e.g., the second pitch P2) of the routing patterns M2a_O. If the realigning operation is omitted, the routing patterns M2a_O might not be placed near the internal interconnection line patterns M2a_I.

Figure 7:
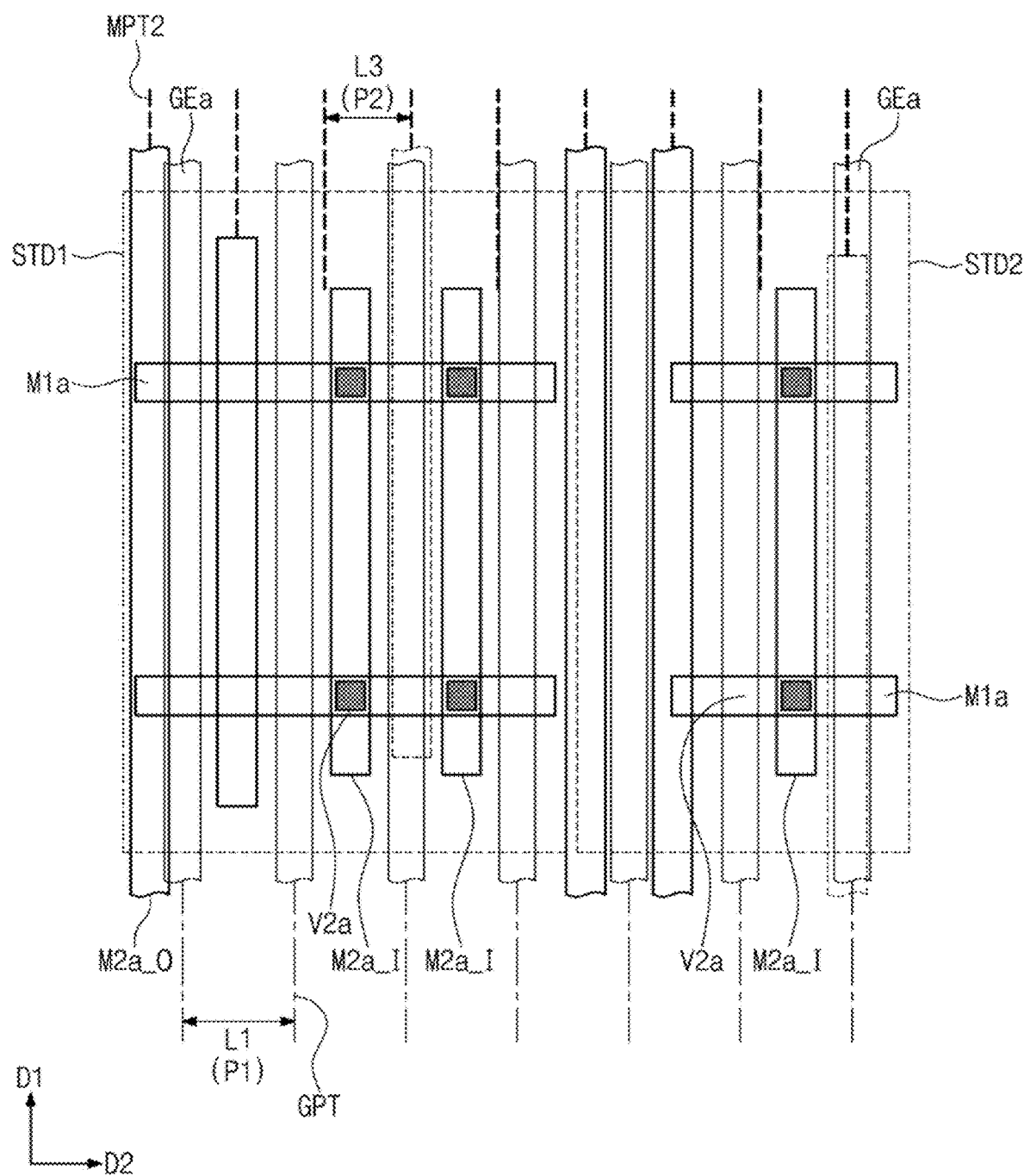
FIG. 7 is a layout when a realignment operation according to an exemplary embodiment of the present inventive concept is omitted.

FIG. 7 is a layout when a realignment operation according to an exemplary embodiment of the present inventive concept is omitted. Referring to FIG. 7, when the operation of realigning the internal interconnection line patterns M2a_I described with reference to FIG. 5 is omitted, positions of the internal interconnection line patterns M2a of FIG. 7 may be the same as the positions of the internal interconnection line patterns M2a_I of FIG. 4. Unlike FIG. 6, the routing pattern M2a_O might not be placed between a pair of the internal interconnection line patterns M2a_I in the first standard cell STD1 of FIG. 7. If the routing pattern M2a_O is placed between the pair of internal interconnection line patterns M2a_I of FIG. 7, the patterns M2a_O and M2a_I may be too close to each other, and thus a process margin might not be secured. In addition, the routing pattern M2a_O might not be placed at one side of the internal interconnection line pattern M2a_O of the second standard cell STD2 of FIG. 7, unlike FIG. 6. If the routing pattern M2a_O is placed at the one side of the internal interconnection line pattern M2a_I, the patterns M2a_O and M2a_I may be too close to each other, and thus a process margin might not be secured.

The number of the routing patterns M2a_O placed in FIG. 6 is greater than the number of the routing patterns M2a_O placed in FIG. 7. As a result, since the method of placing and routing the standard cells according to an exemplary embodiment of the present inventive concept includes the realigning operation, a pattern density of the second interconnection line patterns M2a in the standard cell may be increased.

Figure 8A:
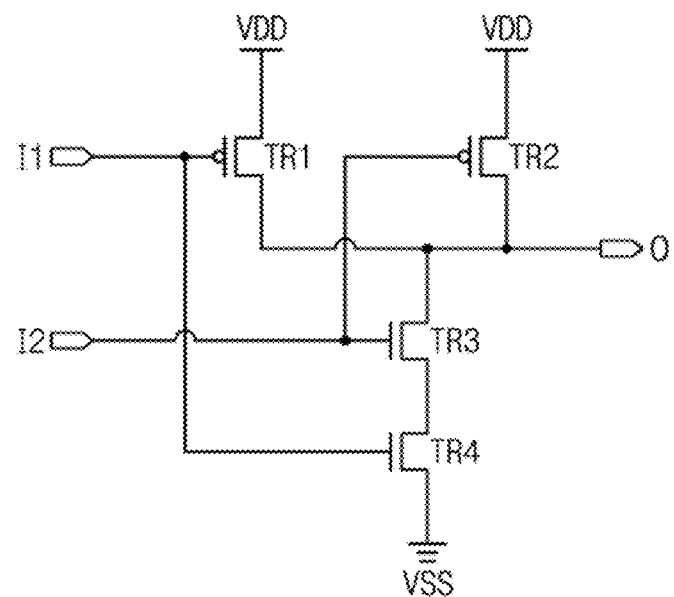
FIG. 8A is a circuit diagram illustrating a standard cell according to an exemplary embodiment of the present inventive concept.
Figure 8B:
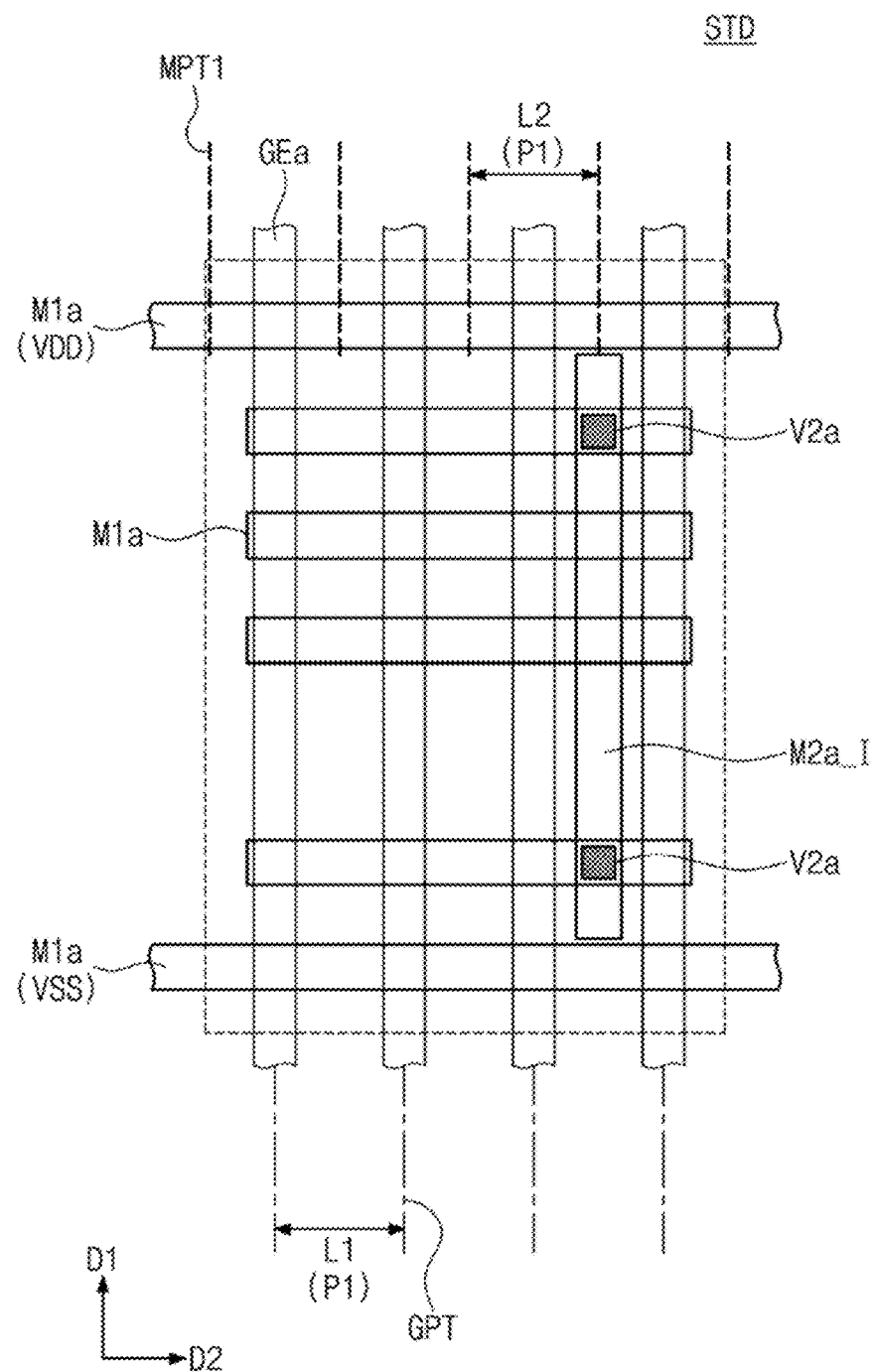
FIG. 8B is a layout of the standard cell corresponding to the circuit diagram of FIG. 8A.
Figure 9:
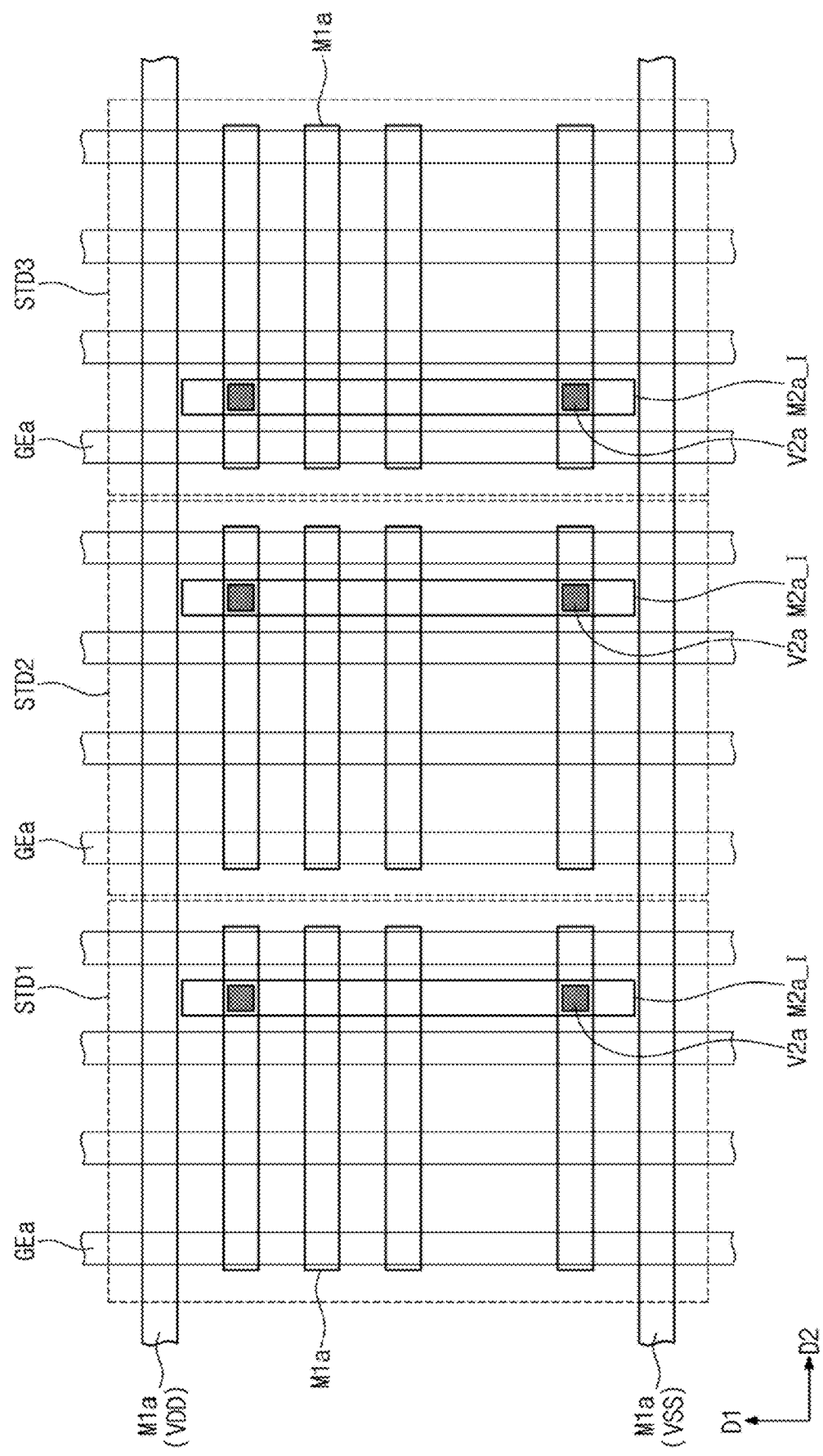
FIGS. 9 to 11 are each layouts according to an exemplary embodiment of the present inventive concept in the operation of placing and routing the standard cells in FIG. 3.
Figure 10:
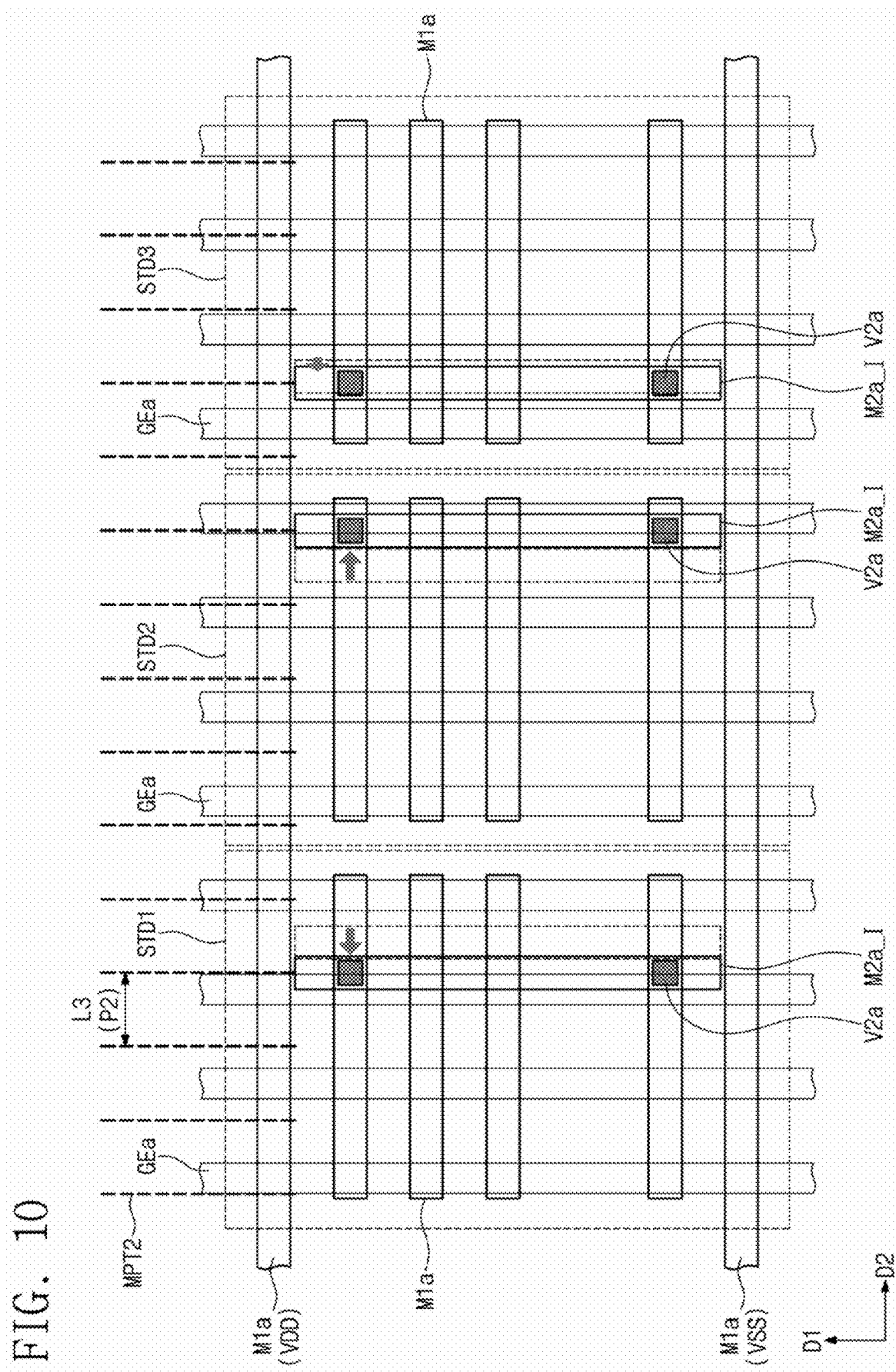
Figure 11:
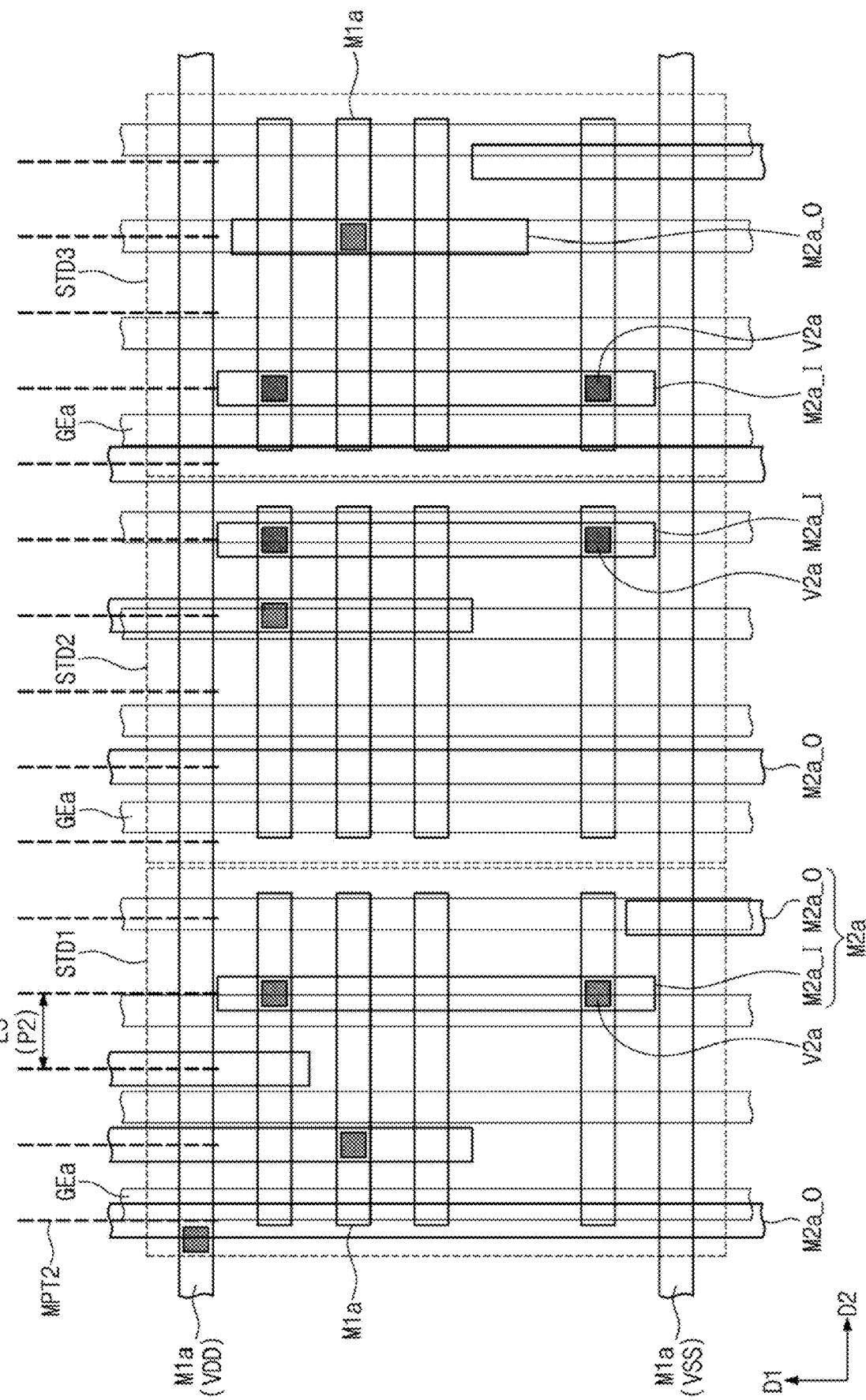
Figure 12:
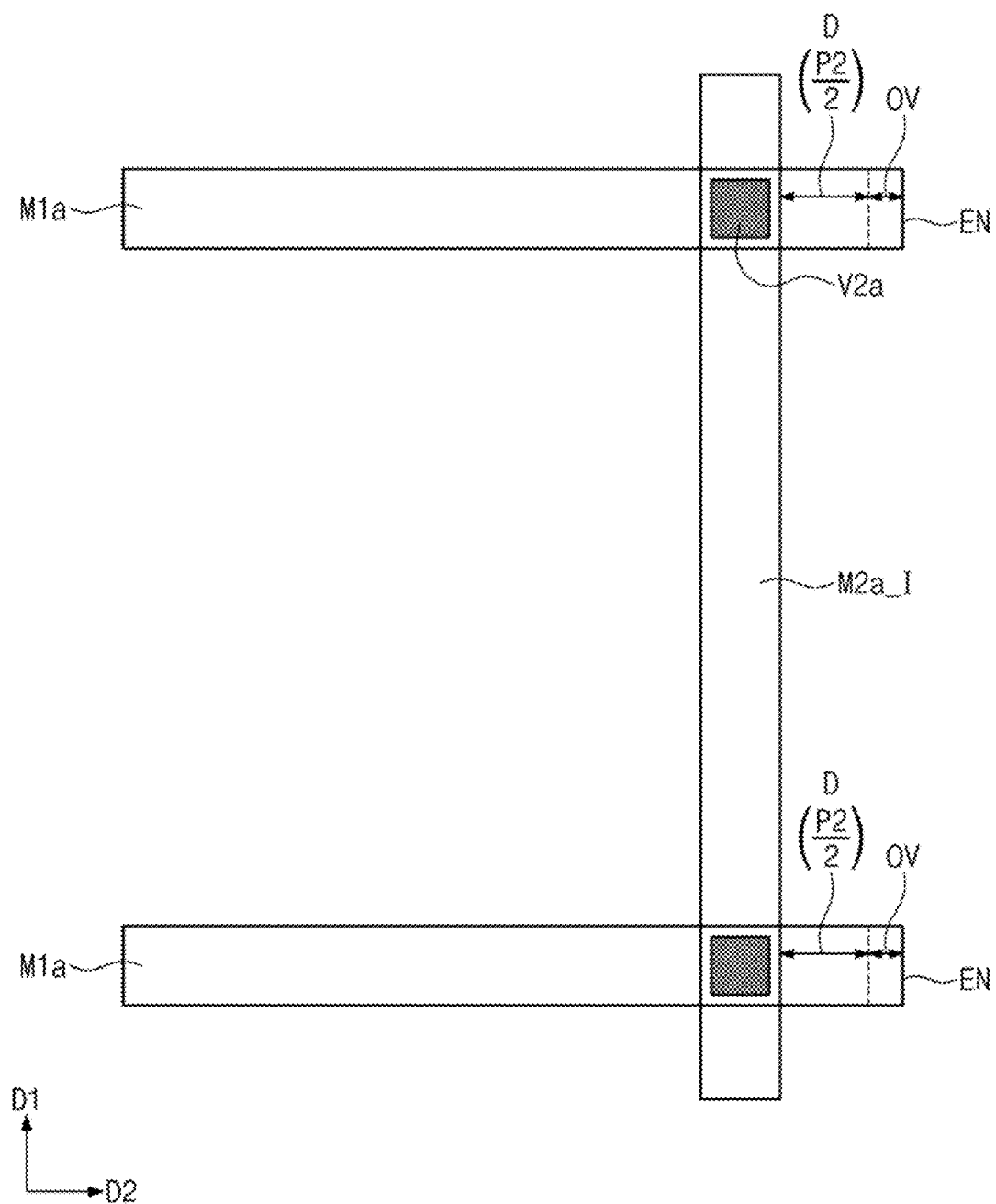
FIGS. 12 and 13 are each enlarged plan views illustrating internal interconnection line patterns and first interconnection line patterns connected thereto of FIGS. 9 and 10, respectively.
Figure 13:
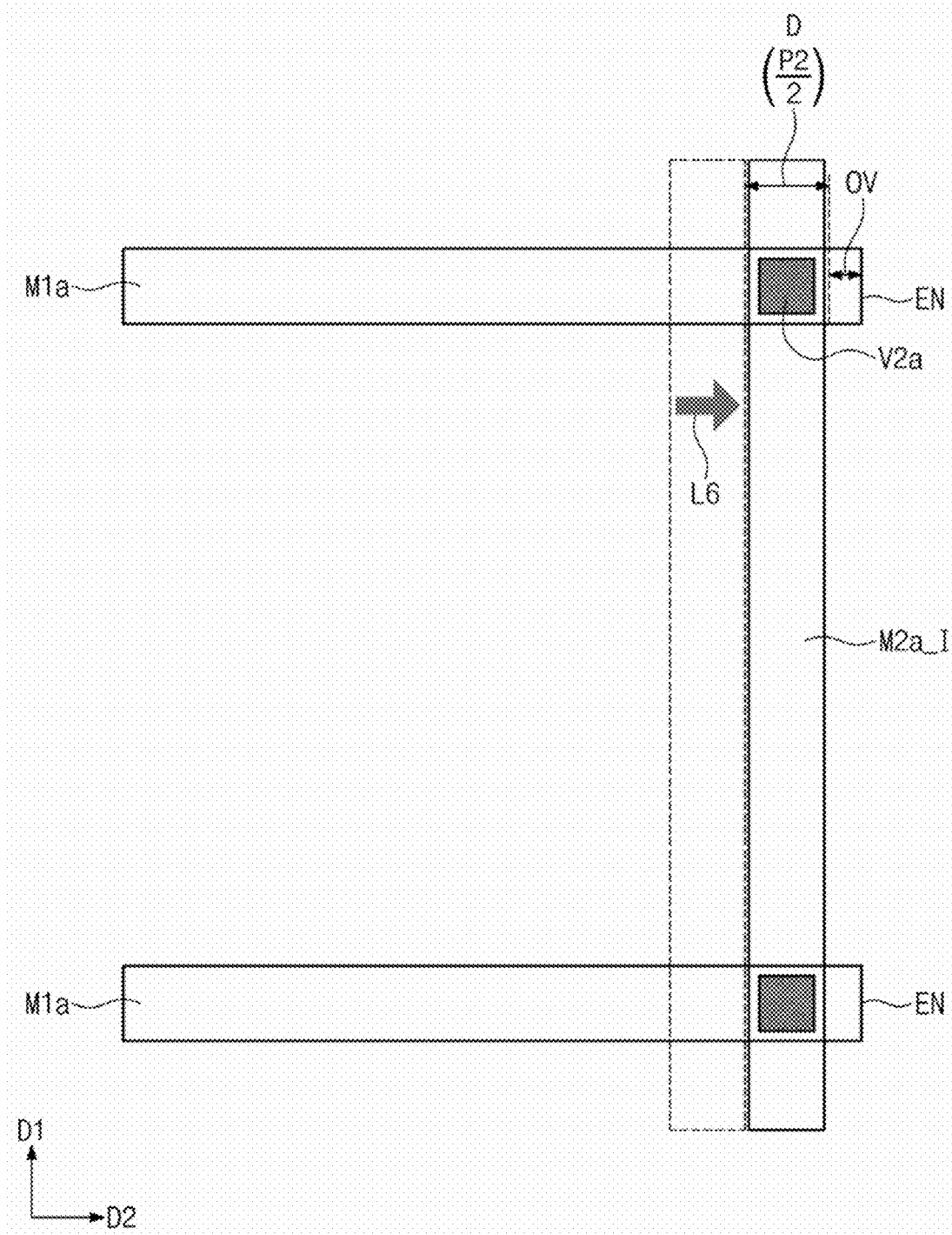

One or more exemplary embodiments of the present inventive concept described above may be described below in more detail and duplicative descriptions may be omitted below. FIG. 8A is a circuit diagram illustrating a standard cell STD according to an exemplary embodiment of the present inventive concept. FIG. 8B is a layout of the standard cell STD corresponding to the circuit diagram of FIG. 8A. FIGS. 9 to 11 are each layouts according to an exemplary embodiment of the present inventive concept in the operation of placing and routing the standard cells in FIG. 3. FIGS. 12 and 13 are each enlarged plan views illustrating internal interconnection line patterns and first interconnection line patterns connected thereto of FIGS. 9 and 10, respectively. The descriptions to the same technical features as those described above with reference to FIGS. 3 to 6 may be omitted below or mentioned briefly. Thus, differences from the technical features described above with reference to FIGS. 3 to 6 will be focused on below.

Referring to FIG. 8A, a standard cell STD according to an exemplary embodiment of the present inventive concept may be a NAND2 standard cell. The standard cell STD of an exemplary embodiment of the present inventive concept may include first to fourth transistors TR1, TR2, TR3 and TR4. The first and second transistors TR1 and TR2 may be PMOS transistors. The third and fourth transistors TR3 and TR4 may be NMOS transistors.

The first transistor TR1 may be connected between a node supplied with a power voltage VDD and an output node O. A first input I1 may be transmitted to a gate of the first transistor TR1. The second transistor TR2 may be connected between the node supplied with the power voltage VDD and the output node O. A second input I2 may be transmitted to a gate of the second transistor TR2. The first and second transistors TR1 and TR2 may be connected in parallel between the node supplied with the power voltage VDD and the output node O.

The third transistor TR3 may be connected between the output node O and the fourth transistor TR4. The second input I2 may be transmitted to a gate of the third transistor TR3. The fourth transistor TR4 may be connected between a node supplied with a ground voltage VSS and the third transistor TR3. The first input I1 may be transmitted to a gate of the fourth transistor TR4. The third and fourth transistors TR3 and TR4 may be connected in series between the node supplied with the ground voltage VSS and the output node O.

Referring to FIGS. 8A and 8B, the standard cell STD of an exemplary embodiment of the present inventive concept may include gate patterns GEa, first interconnection line patterns M a, the internal interconnection line pattern M2a_I, and via patterns V2a. Other layout patterns (e.g., active patterns, active contact patterns, and/or gate contact patterns) are omitted in the standard cell STD of FIG. 8B for clarity of description; however, the other layout patterns may be included in the standard cell STD. The gate patterns GEa may be aligned with gate pattern tracks GPT (e.g., along the first direction D1). The minimum pitch between the gate patterns GEa may be a first pitch P1.

Some of the first interconnection line patterns may define first interconnection lines for supplying the power voltage VDD and the ground voltage VSS. The internal interconnection line pattern M2a_I may define an interconnection line constituting the NAND2 circuit. As an example, the internal interconnection line pattern M2a_I may correspond to the output node O of the NAND2 circuit. The via patterns V2a may provide vertical connection between the internal interconnection line pattern M2a_1 and the first interconnection line patterns M1a.

The internal interconnection line pattern M2a_I may be aligned with a corresponding one of first interconnection line pattern tracks MPT1 (e.g., along the first direction D1). A distance between the first interconnection line pattern tracks MPT1 may be the first pitch P1 equal to the distance between the gate pattern tracks GPT.

Referring to FIGS. 3, 9, and 12, the NAND2 standard cell STD described with reference to FIGS. 8A and 8B may be provided in plurality, and the plurality of NAND2 standard cells STD may be placed to be arranged in a second direction D2 (e.g., in step S110). For example, first to third standard cells STD1, STD2 and STD3 may be arranged in the second direction D2. The first to third standard cells STD1, STD2 and STD3 may be the same as each other and may be the NAND2 standard cells STD of FIG. 8B. The third standard cell STD3 and each of the first and second standard cells STD1 and STD2 may be mirror-symmetrical. The first to third standard cells STD1, STD2 and STD3 may be placed based on a gate pitch. The gate pitch may be the first pitch P1, as illustrated in FIG. 8B.

Referring again to FIG. 12, each of the first interconnection line pattern M1a connected to the internal interconnection line pattern M2a_I may include an end EN in each of the first to third standard cells STD1 to STD3. The end EN may be adjacent to one side of the internal interconnection line pattern M2a_I. A distance between the end EN and the one side of the internal interconnection line pattern M2a_I may be a sum of a first margin D and a second margin OV. The first margin D may be a half of a second pitch P2 that is the minimum pitch between second interconnection line patterns M2a to be described in more detail below (D=P2/2). The second margin OV may be the minimum margin that is set to prevent a process failure. The minimum margin may be a value that is capable of preventing a contact failure which may be caused by distortion of a pattern when the pattern is realized in a process. The minimum margin may be defined by a design rule. Thus, by applying the minimum margin, a defect rate in a semiconductor device may be reduced, and process margins may be increased.

Referring to FIGS. 3, 10, and 13, the internal interconnection line patterns M2a_I in the first to third standard cells STD1 to STD3 may be realigned (e.g., in step S120). After the first to third standard cells STD1 to STD3 are placed, new second interconnection line pattern tracks MPT2 may be set instead of the first interconnection line pattern tracks MPT1 illustrated in FIG. 8B. A third distance L3 between a pair of the second interconnection line pattern tracks MPT2 adjacent to each other may be smaller than the second distance L2 between the pair of first interconnection line pattern tracks MPT1 adjacent to each other. The internal interconnection line patterns M2a_I in the first to third standard cells STD1 to STD3 may be realigned with the second interconnection line pattern tracks MPT2. The via patterns V2a may also be realigned with the second interconnection line pattern tracks MPT2, along with the internal interconnection line patterns M2a_I.

In the realigning operation (S120), the internal interconnection line patterns M2a_I may be laterally moved in parallel to the second direction D2. In the realigning operation (e.g., step S120), movement distances and movement directions of the internal interconnection line patterns M2a_I may be the same as or different from each other. The maximum movement distance at which the internal interconnection line patterns M2a can be moved may be a half of the third distance L3 (L3/2). As an example, the maximum movement distance of the internal interconnection line patterns M2a_I may be a half of the second pitch P2 (P2/2). For example, the internal interconnection line pattern M2a_I of the second standard cell STD2 may be located at a center between a pair of the second interconnection line pattern tracks MPT2, and the internal interconnection line pattern M2a_I may be moved by the maximum movement distance so as to be realigned with one of the second interconnection line pattern tracks MPT2.

Referring again to FIG. 13, for example, the internal interconnection line pattern M2a_I of the second standard cell STD2 may be moved in the second direction D2 by a sixth distance L6. The sixth distance L6 may be substantially equal or similar to the maximum movement distance. The sixth distance L6 may be about a half of the second pitch P2. Since the first interconnection line pattern M1a of FIG. 12 has the first margin D as well as the second margin OV, at least the second margin OV may be secured even though the internal interconnection line pattern M2a_I is realigned to approach the one end EN of the first interconnection line pattern M1a. As a result, it is possible to prevent a process failure from occurring by the realignment of the internal interconnection line pattern M2a_I.

Referring to FIGS. 3 and 11, the operation of routing the standard cells may be performed to place routing patterns M2a_O in the first to third standard cells SD1, SD2 and SD3 (e.g., in step S130). The routing patterns M2a_O may be aligned with the second interconnection line pattern tracks MPT2. The placed routing patterns M2a_O and the internal interconnection line patterns M2a_I may constitute second interconnection line patterns M2a. The minimum pitch between the second interconnection line patterns M2a may be the second pitch P2 equal to the third distance L3. The second pitch P2 may be smaller than the first pitch P1 which is the gate pitch. A distance between central lines of the second interconnection line patterns M2a may be n×P2 where "n" is an integral number equal to or greater than 1.

Figure 14:
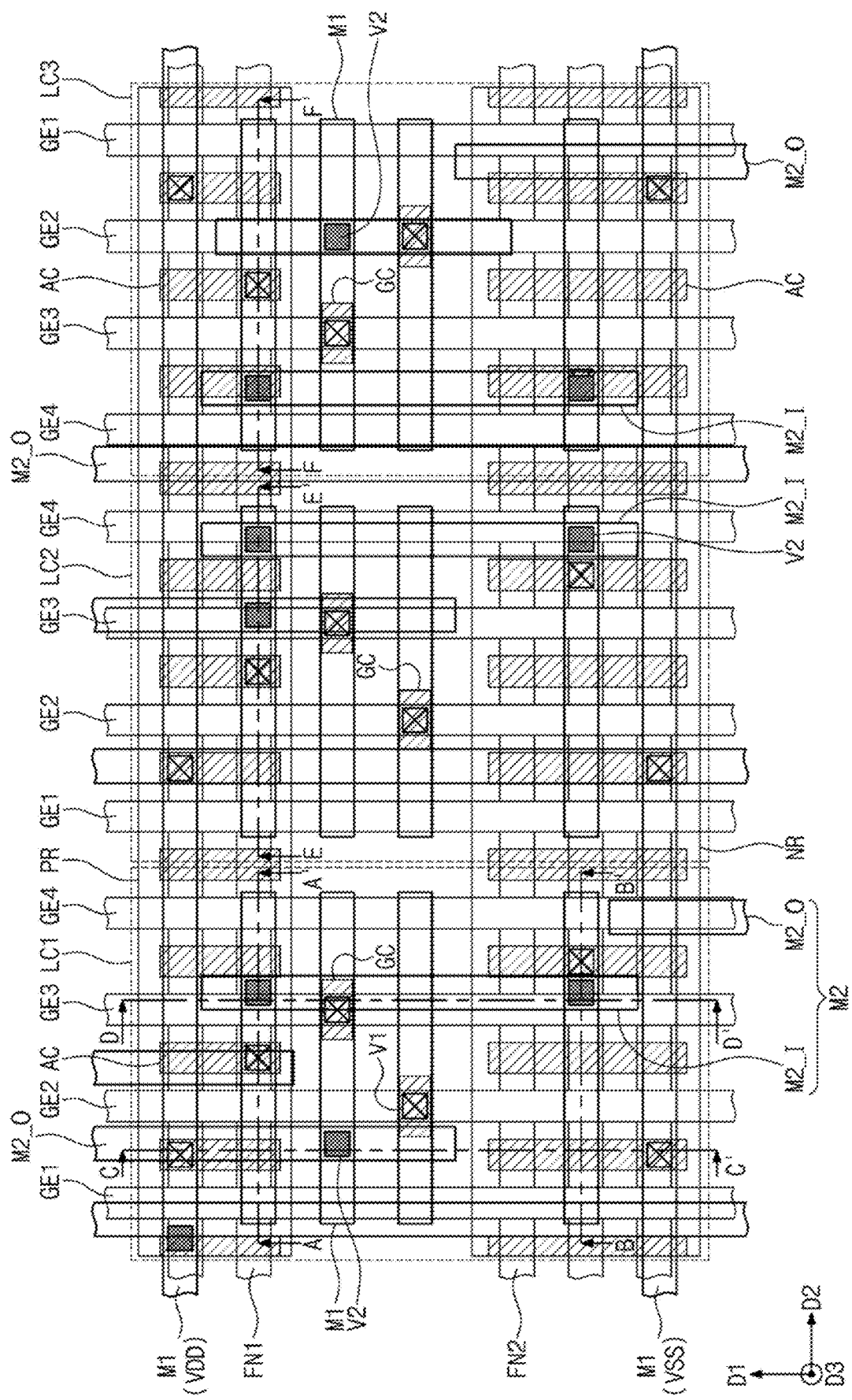
FIG. 14 is a plan view illustrating a semiconductor device according to an exemplary embodiment of the present inventive concept.

FIG. 14 is a plan view illustrating a semiconductor device according to an exemplary embodiment of the present inventive concept. FIGS. 15A, 15B, 15C, 15D, 15E and 15F are cross-sectional views taken along lines A-A', B-B', C-C', D-D', E-E', and F-F' of FIG. 14, respectively. A semiconductor device described with reference to FIGS. 14 and 15A, 15B, 15C, 15D, 15E and 15F is an example of a semiconductor device that is formed on a real substrate by using the designed layout described with reference to FIG. 11.

Referring to FIGS. 14 and 15A, 15B, 15C, 15D, 15E and 15F, first to third logic cells LC1, LC2 and LC3 may be provided. The first to third logic cells LC1, LC2 and LC3 may be arranged in the second direction D2. Each of the first to third logic cells LC1, LC2 and LC3 may include a logic circuit. In an exemplary embodiment of the present inventive concept, logic transistors included in the logic circuit may be disposed on each of the first to third logic cells LC1, LC2 and LC3.

In an exemplary embodiment of the present inventive concept, the first to third logic cells LC1, LC2 and LC3 may include the same logic circuit as each other. For example, the logic circuits of each the first to third logic cells LC1, LC2 and LC3 may have the same structure as each other. For example, the first to third logic cells LC1, LC2 and LC3 may be NAND2 cells that are the same as each other. The first and second logic cells LC1 and LC2 may have the same transistor structure and the same internal interconnection line structure. Transistor and internal interconnection line structures of the third logic cell LC3 and the transistor and internal interconnection line structures of each of the first and second logic cells LC1 and LC2 may be mirror-symmetrical. The logic transistors and interconnection lines included in the first to third logic cells LC1 to LC3 will be described in more detail below.

A substrate 100 may be provided. For example, the substrate 100 may be a silicon substrate, a germanium substrate, or a silicon-on-insulator (SOI) substrate. Second device isolation layers ST2 may be provided in the substrate 100 to define a PMOSFET region PR and an NMOSFET region NR. The second device isolation layers ST2 may be formed in an upper portion of the substrate 100. For example, the second device isolation layers ST2 may be positioned at an uppermost portion of the substrate 100.

The PMOSFET region PR and the NMOSFET region NR may be spaced apart from each other in the first direction D1 with the second device isolation layer ST2 disposed therebetween. The PMOSFET region PR and the NMOSFET region NR may extend in the second direction D2 to intersect the first to third logic cells LC1, LC2 and LC3. The second device isolation layers ST2 may further define additional PMOSFET regions and additional NMOSFET regions as well as the PMOSFET region PR and the NMOSFET region NR.

A plurality of first active patterns FN1 extending in the second direction D2 may be provided on the PMOSFET region PR. A plurality of second active patterns FN2 extending in the second direction D2 may be provided on the NMOSFET region NR. The first and second active patterns FN1 and FN2 may be portions of the substrate 100, which protrude from a top surface of the substrate 100. The first and second active patterns FN1 and FN2 may be arranged along the first direction D1.

For example, two first active patterns FN1 may extend in the second direction D2 substantially in parallel to each other on the PMOSFET region PR. For example, three second active patterns FN2 may extend in the second direction D2 in parallel to each other on the NMOSFET region NR. However, the number and shapes of the first active patterns FN1 on the PMOSFET region PR and the number and shapes of the second active patterns FN2 on the NMOSFET region NR are illustrated as an example and exemplary embodiments of the present inventive concept are not limited thereto.

First device isolation layers ST1 extending in the second direction D2 may be disposed at both sides of each of the first and second active patterns FN1 and FN2. Some of the first device isolation layers ST1 may fill trenches between the first active patterns FN1. Others of the first device isolation layers ST1 may fill trenches between the second active patterns FN2.

Upper portions of the first and second active patterns FN1 and FN2 may be higher than top surfaces of the first device isolation layers ST1. The upper portions of the first and second active patterns FN1 and FN2 may vertically protrude from the first device isolation layers ST1. The upper portion of each of the first and second active patterns FN1 and FN2 may have a fin-shape protruding from between a pair of the first device isolation layers ST1.

The second device isolation layers ST2 and the first device isolation layers ST1 may be connected to each other to form one insulating layer. Top surfaces of the second device isolation layers ST2 may be coplanar with the top surfaces of the first device isolation layers ST1. Thicknesses (or depths) of the second device isolation layers ST2 may be greater than thicknesses (or depths) of the first device isolation layers ST1. In this case, the first device isolation layers ST1 may be formed by a process different from a process of forming the second device isolation layers ST2. For example, the first and second device isolation layers ST1 and ST2 may include a silicon oxide layer.

First channel regions CH1 and first source/drain regions SD1 may be provided in the upper portions of the first active patterns FN1. The first source/drain regions SD1 may be P-type dopant regions. Each of the first channel regions CH1 may be disposed between a pair of the first source/drain regions SD1 adjacent to each other. Second channel regions CH2 and second source/drain regions SD2 may be provided in the upper portions of the second active patterns FN2. The second source/drain regions SD2 may be N-type dopant regions. Each of the second channel regions CH2 may be disposed between a pair of the second source/drain regions SD2 adjacent to each other.

The first and second source/drain regions SD1 and SD2 may include epitaxial patterns formed by a selective epitaxial growth (SEG) process. Top surfaces of the first and second source/drain regions SD1 and SD2 may be disposed at a higher level than top surfaces of the first and second channel regions CH1 and CH2. Each of the first and second source/drain regions SD1 and SD2 may include a semiconductor element different from that of the substrate 100. In an exemplary embodiment of the present inventive concept, the first source/drain regions SD1 may include a semiconductor element of which a lattice constant is greater than that of the semiconductor element of the substrate 100. Thus, the first source/drain regions SD1 may provide compressive stress to the first channel regions CH1. In an exemplary embodiment of the present inventive concept, the second source/drain regions SD2 may include a semiconductor element of which a lattice constant is smaller than that of the semiconductor element of the substrate 100. Thus, the second source/drain regions SD2 may provide tensile stress to the second channel regions CH2. In an exemplary embodiment of the present inventive concept, the second source/drain regions SD2 may include the same semiconductor element as the substrate 100.

Figure 15A:
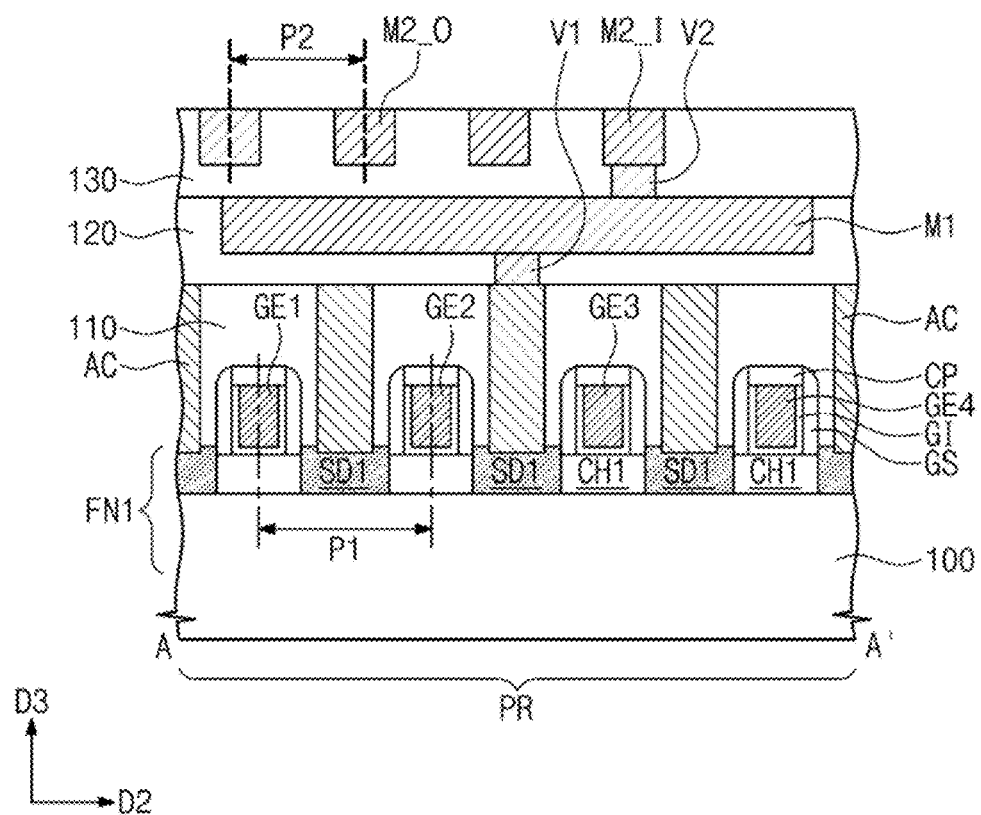
FIGS. 15A, 15B, 15C, 15D, 15E and 15F are cross-sectional views taken along lines A-A', B-B', C-C', D-D', E-E', and F-F' of FIG. 14, respectively.
Figure 15B:
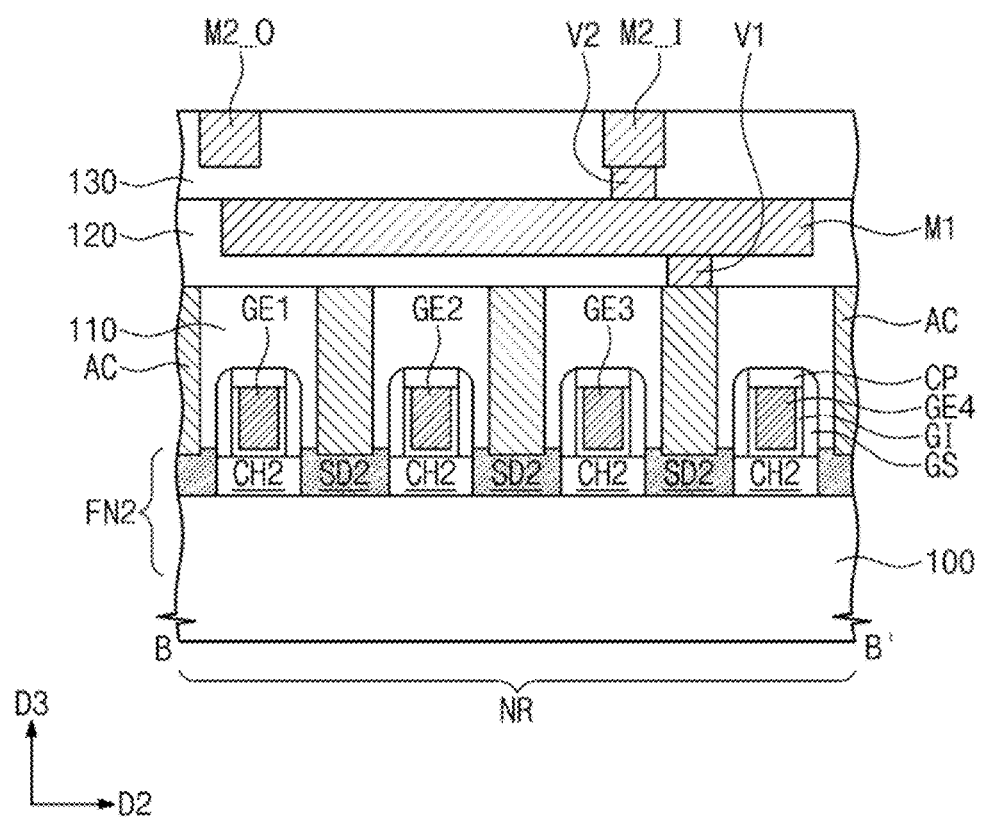
Figure 15C:
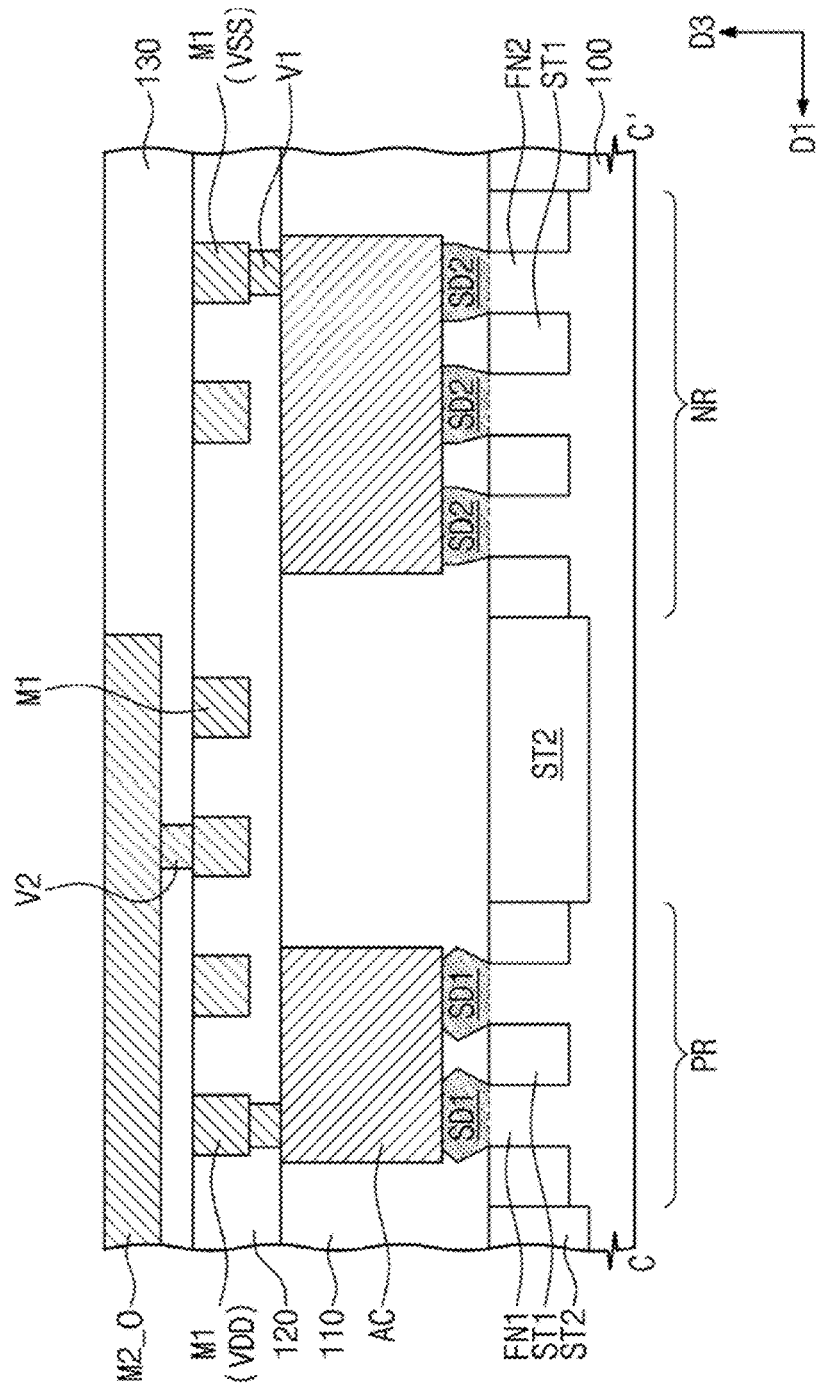
Figure 15D:
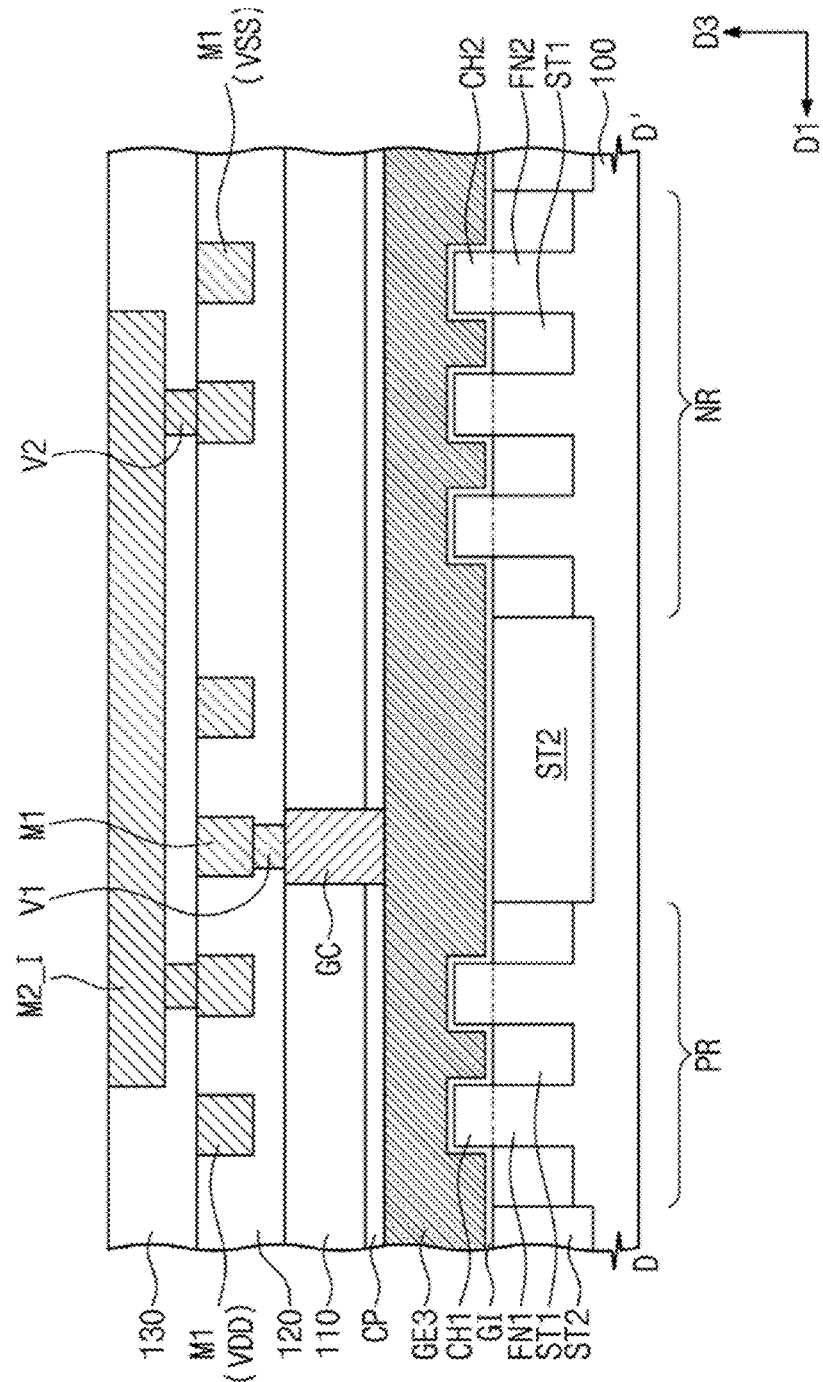
Figure 15E:
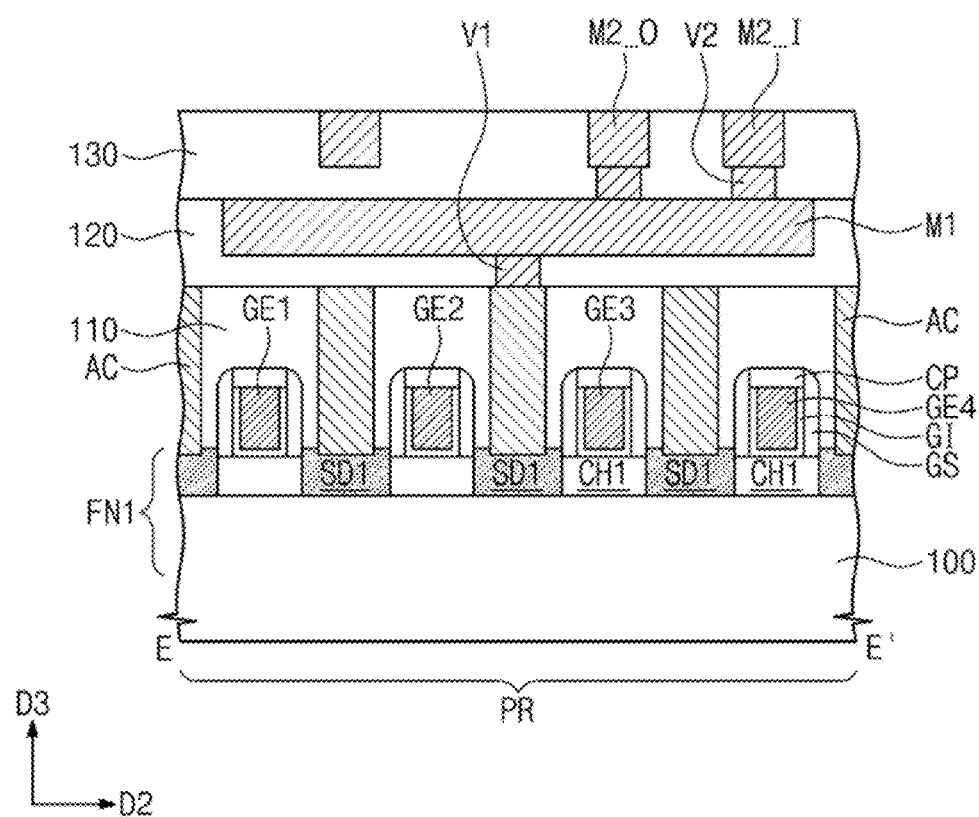
Figure 15F:
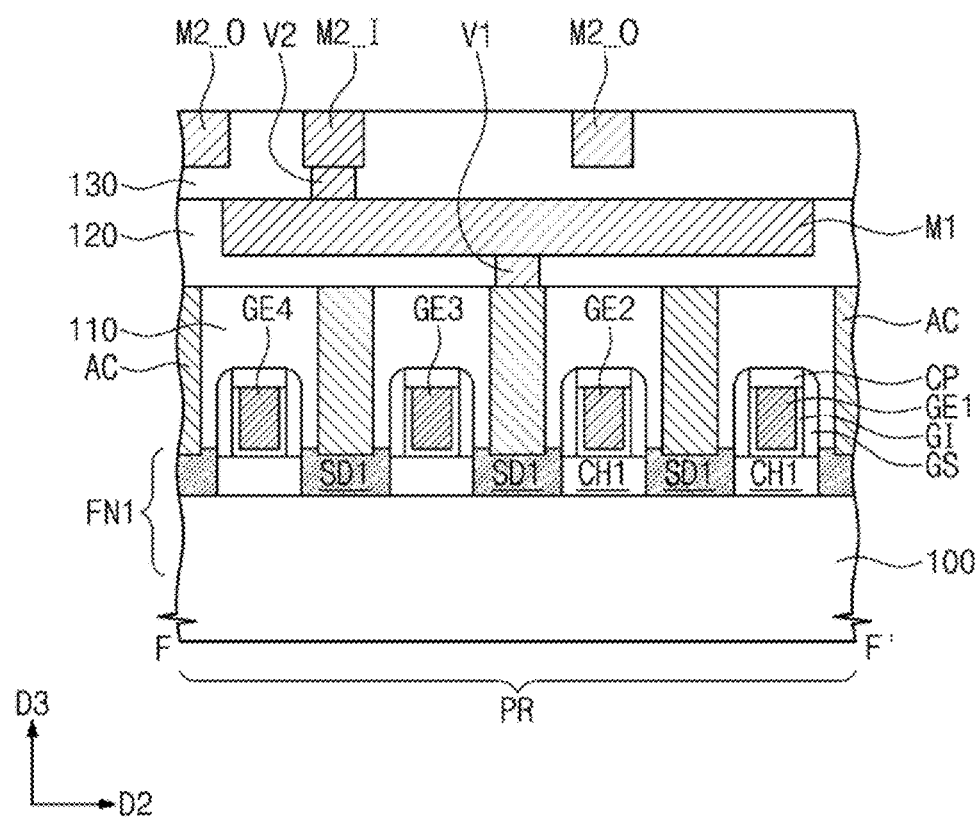

Cross-sectional shapes of the first source/drain regions SD1 may be different from cross-sectional shapes of the second source/drain regions SD2 when viewed in a cross-sectional view taken along the first direction D1 (see, e.g., FIG. 15C). For example, the first source/drain regions SD1 may include silicon-germanium (SiGe), and the second source/drain regions SD2 may include silicon.

Gate electrodes GE1, GE2, GE3 and GE4 extending in the first direction D1 may be provided to intersect the first and second active patterns FN1 and FN2. The gate electrodes GE1, GE2, GE3 and GE4 may be spaced apart from each other in the second direction D2. The minimum pitch between the gate electrodes GE1, GE2, GE3 and GE4 may be a first pitch P1. The gate electrodes GE1, GE2, GE3 and GE4 may be arranged at equal distances in accordance with the first pitch P1. For example, the gate electrodes GE1, GE2, GE3 and GE4 may be evenly spaced apart from each other along the second direction D2.

The gate electrodes GE1 to GE4 may vertically overlap with the first and second channel regions CH1 and CH2 (e.g., along the third direction D3). Each of the gate electrodes GE1, GE2, GE3 and GE4 may surround a top surface and both sidewalls of each of the first and second channel regions CH1 and CH2 (see, e.g., FIG. 15D). For example, the gate electrodes GE1, GE2, GE3 and GE4 may each include at least one of a conductive metal nitride (e.g., titanium nitride or tantalum nitride) or a metal material (e.g., titanium, tantalum, tungsten, copper, or aluminum).

A pair of gate spacers GS may be disposed on both sidewalls of each of the gate electrodes GE1, GE2, GE3 and GE4, respectively. The gate spacers GS may extend along the gate electrodes GE1, GE2, GE3 and GE4 in the first direction D1. Top surfaces of the gate spacers GS may be higher than top surfaces of the gate electrodes GE to GE4. The top surfaces of the gate spacers GS may be coplanar with a top surface of a gate capping layer CP to be described later. For example, the gate spacers GS may include at least one of SiCN, SiCON, or SiN. In an exemplary embodiment of the present inventive concept, each of the gate spacers GS may have a multi-layered structure formed of at least two of SiCN, SiCON, or SiN.

Gate dielectric layers GI may be disposed between the gate electrodes GE1, GE2, GE3 and GE4 and the active patterns FN1 and FN2. Each of the gate dielectric layers GI may extend along a bottom surface of each of the gate electrodes GE1 to GE4. Each of the gate dielectric layers GI may cover the top surface and the both sidewalls of each of the first and second channel regions CH1 and CH2. The gate dielectric layers GI may include a high-k dielectric material of which a dielectric constant is higher than that of silicon oxide. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate capping layer CP may be provided on each of the gate electrodes GE1, GE2, GE3 and GE4. The gate capping layers CP may extend along the gate electrodes GE1 to GE4 in the first direction D1. The gate capping layers CP may include a material having an etch selectivity with respect to a first interlayer insulating layer 110 to be described in more detail below. For example, the gate capping layers CP may include at least one of SiON, SiCN, SiCON, or SiN.

The gate electrodes GE1, GE2, GE3 and GE4 may be included in each of the first to third logic cells LC1, LC2 and LC3. The gate electrodes GE1, GE2, GE3 and GE4 may intersect each of the first to third logic cells LC1, LC2 and LC3. The gate electrodes GE1, GE2, GE3 and GE4 may be sequentially arranged in the second direction D2 in each of the first and second logic cells LC1 and LC2. As an example, in the third logic cell LC3, the gate electrodes GE1, GE2, GE3 and GE4 may be sequentially arranged in a direction opposite to the second direction D2. This is because the third logic cell LC3 and each of the first and second logic cells LC1 and LC2 are mirror-symmetrical.

The first interlayer insulating layer 110 may be provided to cover the first and second active patterns FN1 and FN2, the gate spacers GS, and the gate capping layers CP. A second interlayer insulating layer 120 and a third interlayer insulating layer 130 may be sequentially stacked on the first interlayer insulating layer 110. Each of the first to third interlayer insulating layers 110, 120 and 130 may include a silicon oxide layer and/or a silicon oxynitride layer.

Active contacts AC may penetrate the first interlayer insulating layer 110 between the gate electrodes GE1, GE2, GE3 and GE4 to be electrically connected to the first and second source/drain regions SD1 and SD2. The active contacts AC may have bar shapes extending in the first direction D1. In an exemplary embodiment of the present inventive concept, one active contact AC may be connected to a plurality of the first source/drain regions SD1. In an exemplary embodiment of the present inventive concept, one active contact AC may be connected to a plurality of the second source/drain regions SD2. In an exemplary embodiment of the present inventive concept, one active contact AC may be connected to one first source/drain region SD1 or one second source/drain region SD2. However, exemplary embodiments of the present inventive concept are not limited thereto.

At least one gate contact GC (see, e.g., FIG. 14) may penetrate the first interlayer insulating layer 110 and the gate capping layer CP to be electrically connected to at least one of the gate electrodes GE1, GE2, GE3 and GE4. The gate contacts GC may have bar shapes extending in the second direction D2. For example, the gate contacts GC may be provided on the second and third gate electrodes GE2 and GE3. The gate contacts GC may be disposed between the PMOSFET region PR and the NMOSFET region NR when viewed in a plan view. The gate contacts GC may vertically overlap with the second device isolation layer ST2 between the PMOSFET region PR and the NMOSFET region NR.

The active contacts AC and the gate contacts GC may include a same conductive material as each other. For example, the active contacts AC and the gate contacts GC may include at least one of aluminum, copper, tungsten, molybdenum, or cobalt.

First interconnection lines M1 and first vias V1 may be provided in the second interlayer insulating layer 120. The first interconnection lines M1 and the first vias V1 may be included in a first metal layer. The first interconnection lines M1 may include power and ground interconnection lines VDD and VSS that extend in the second direction D2 to intersect the first to third logic cells LC1, LC2 and LC3. Each of the first interconnection lines M1 may have a line or bar shape extending in the second direction D2. As an example, the first interconnection lines M1 may extend in the second direction D2 substantially in parallel to each other.

Some of the first vias V1 may be disposed between the active contacts AC and corresponding ones of the first interconnection lines M1 to electrically connect the active contacts AC to the corresponding ones of the first interconnection lines M1. Others of the first vias V1 may be disposed between the gate contacts GC and corresponding ones of the first interconnection lines M1 to electrically connect the gate contacts GC to the corresponding ones of the first interconnection lines M1. The first interconnection line M1 and the first via V1 disposed thereunder may be connected to each other to form a single unitary conductive structure. As an example, the first interconnection line M1 and the first via V1 may be formed together (e.g., may be formed by a single continuous process). For example, the first interconnection line M1 and the first via V1 may be formed as the single unitary conductive structure by using a dual damascene process.

The shapes and positions of the active contacts AC, the gate contacts GC, the first vias V1 and the first interconnection lines M1 in the first logic cell LC1 may be substantially the same as the shapes and positions of the active contacts AC, the gate contacts GC, the first vias V1 and the first interconnection lines M1 in the second logic cell LC2. This is because the first logic cell LC1 and the second logic cell LC2 include the same logic circuit. The contacts AC and GC, the first vias V1 and the first interconnection lines M1 in the second logic cell LC2 and the contacts AC and GC, the first vias V1 and the first interconnection lines M1 in the third logic cell LC3 may be mirror-symmetrical.

Second interconnection lines M2 and second vias V2 may be provided in the third interlayer insulating layer 130. The second interconnection lines M2 may include internal interconnection lines M2_I and routing interconnection lines M2_O. The second interconnection lines M2 and the second vias V2 may be included in a second metal layer. Each of the second interconnection lines M2 may have a line or bar shape extending in the first direction D1. As an example, the second interconnection lines M2 may extend in the first direction D1 substantially in parallel to each other. The second interconnection lines M2 may be parallel to the gate electrodes GE1 to GE4 when viewed in a plan view.

The minimum pitch between the second interconnection lines M2 may be a second pitch P2. A distance between central lines of the second interconnection lines M2 adjacent to each other may be n×P2 where "n" is an integral number equal to or greater than I. The gate electrodes GE1 to GE4 and the second interconnection lines M2 may be formed using the gate patterns GEa and the second interconnection line patterns M2a of the layout of FIG. 1, respectively. The gate electrodes GE1 to GE4 may be formed using the gate patterns GEa aligned with the gate pattern tracks GPT, and the second interconnection lines M2 may be formed using the second interconnection line patterns M2a aligned with the second interconnection line pattern tracks MPT2. Thus, the second pitch P2 which is the minimum pitch between the second interconnection lines M2 may be smaller than the first pitch P which is the pitch between the gate electrodes GE1 to GE4.

The second vias V2 may be disposed between the second interconnection lines M2 and the first interconnection lines M1 to electrically connect the second interconnection lines M2 to the first interconnection lines M1. The second interconnection line M2 and the second via V2 disposed thereunder may be connected to each other. As an example, the second interconnection lines M2 and the second vias V2 may be formed together (e.g., by a single continuous process). For example, the second interconnection lines M2 and the second vias V2 may be formed using a dual damascene process.

The internal interconnection line M2_I in each of the first to third logic cells LC1, LC2 and LC3 may extend from on the PMOSFET region PR onto the NMOSFET region NR. The internal interconnection line M2_I on the PMOSFET region PR may be electrically connected to the first source/drain regions SD1 through the second via V2, the first interconnection line M1, the first via V1 and the active contact AC (see, e.g., FIG. 15A). The internal interconnection line M2_I on the NMOSFET region NR may be electrically connected to the second source/drain regions SD2 through the second via V2, the first interconnection line M1, the first via V1 and the active contact AC (see, e.g., FIG. 15B). As an example, the internal interconnection line M2_I in each of the first to third logic cells LC1 to LC3 may electrically connect a PMOS transistor (PMOSFET) of the PMOSFET region PR to an NMOS transistor (NMOSFET) of the NMOSFET region NR. The internal interconnection line M2_I in each of the first to third logic cells LC1 to LC3 may electrically connect the source/drain of the PMOSFET to the source/drain of the NMOSFET.

The internal interconnection line M2_I in each of the first to third logic cells LC1 to LC3 may be an interconnection line included in the logic circuit. For example, the internal interconnection line M2_I may be the output node of the NAND2 cell. The internal interconnection line M2_I in the first logic cell LC1 might not extend beyond a boundary of the first logic cell LC1. As an example, both ends of the internal interconnection line M2_I may be located in the first logic cell LC1. For example, one end of the internal interconnection line M2_I may be located on the PMOSFET region PR, and another end of the internal interconnection line M2_I may be located on the NMOSFET region NR. The internal interconnection lines M2_I in the second and third logic cells LC2 and LC3 may have substantially the same shape as the internal interconnection line M2_I in the first logic cell LC1.

Even though the first to third logic cells LC1 to LC3 may include the same logic circuit, positions of the internal interconnection lines M2_I in the first to third logic cells LC1 to LC3 may be different from each other. The internal interconnection line M2_I of the first logic cell LC1 may be offset from the third gate electrode GE3 adjacent thereto by a first offset distance in a plan view, and the internal interconnection line M2_I of the second logic cell LC2 may be offset from the third gate electrode GE3 adjacent thereto by a second offset distance in a plan view. The internal interconnection line M2_I of the third logic cell LC3 may be offset from the third gate electrode GE3 adjacent thereto by a third offset distance in a plan view. Thus, the first offset distance, the second offset distance and the third offset distance may be different from each other.

In the first logic cell LC1, the internal interconnection line M2_I may partially overlap with the third gate electrode GE3 in a plan view. In the first logic cell LC1, the internal interconnection line M2_I may be laterally spaced apart from the fourth gate electrode GE4 in a plan view (see, e.g., FIGS. 14 and 15A).

In the second logic cell LC2, the internal interconnection line M21 may partially overlap with the fourth gate electrode GE4 in a plan view. In the second logic cell LC2, the internal interconnection line M2_I may be laterally spaced apart from the third gate electrode GE3 in a plan view (see, e.g., FIGS. 14 and 15E).

In the third logic cell LC3, the internal interconnection line M2_I may be disposed between the third gate electrode GE3 and the fourth gate electrode GE4 in a plan view. In the third logic cell LC3, the internal interconnection line M21 may be laterally spaced apart from both the third gate electrode GE3 and the fourth gate electrode GE4 in a plan view (see, e.g., FIGS. 14 and 15F).

The routing interconnection lines M2_O in each of the first to third logic cells LC1 to LC3 may connect the logic circuit thereof to a logic circuit of another logic cell. As an example, the routing interconnection lines M2_O may be independent of the logic circuits (e.g., the NAND2 circuits) of the first to third logic cells LC1 to LC3. The numbers and shapes of the routing interconnection lines M2_O of the first to third logic cells LC1, LC2 and LC3 may be different from each other. The routing interconnection lines M2_O may extend beyond boundaries of the first to third logic cells LC1 to LC3. Alternatively, at least one routing interconnection line M2_O might not extend beyond the boundaries of the first to third logic cells LC1 to LC3. Illustrated lengths and arrangement of the routing interconnection lines M2_O are an example. However, exemplary embodiments of the present inventive concept are not limited thereto.

The first interconnection lines M1, the first vias V1, the second interconnection lines M2 and the second vias V2 may include a same conductive material as each other. For example, the first interconnection lines M1, the first vias V1, the second interconnection lines M2 and the second vias V2 may include at least one of aluminum, copper, tungsten, molybdenum, or cobalt. Additional metal layers may further be disposed on the third interlayer insulating layer 130. The additional metal layers may include routing interconnection lines.

According to an exemplary embodiment of the present inventive concept, the second pitch P2 which is the minimum pitch between the second interconnection lines M2 may be smaller than the first pitch P1 which is the minimum pitch between the gate electrodes GE1 to GE4. The internal interconnection lines M2_I of the second interconnection lines M2 may be aligned based on the placement distance (i.e., the second pitch P2) of the routing interconnection lines M2_O. Thus, a pattern density of the second interconnection lines M2 in the logic cell may be increased.

Figure 16:
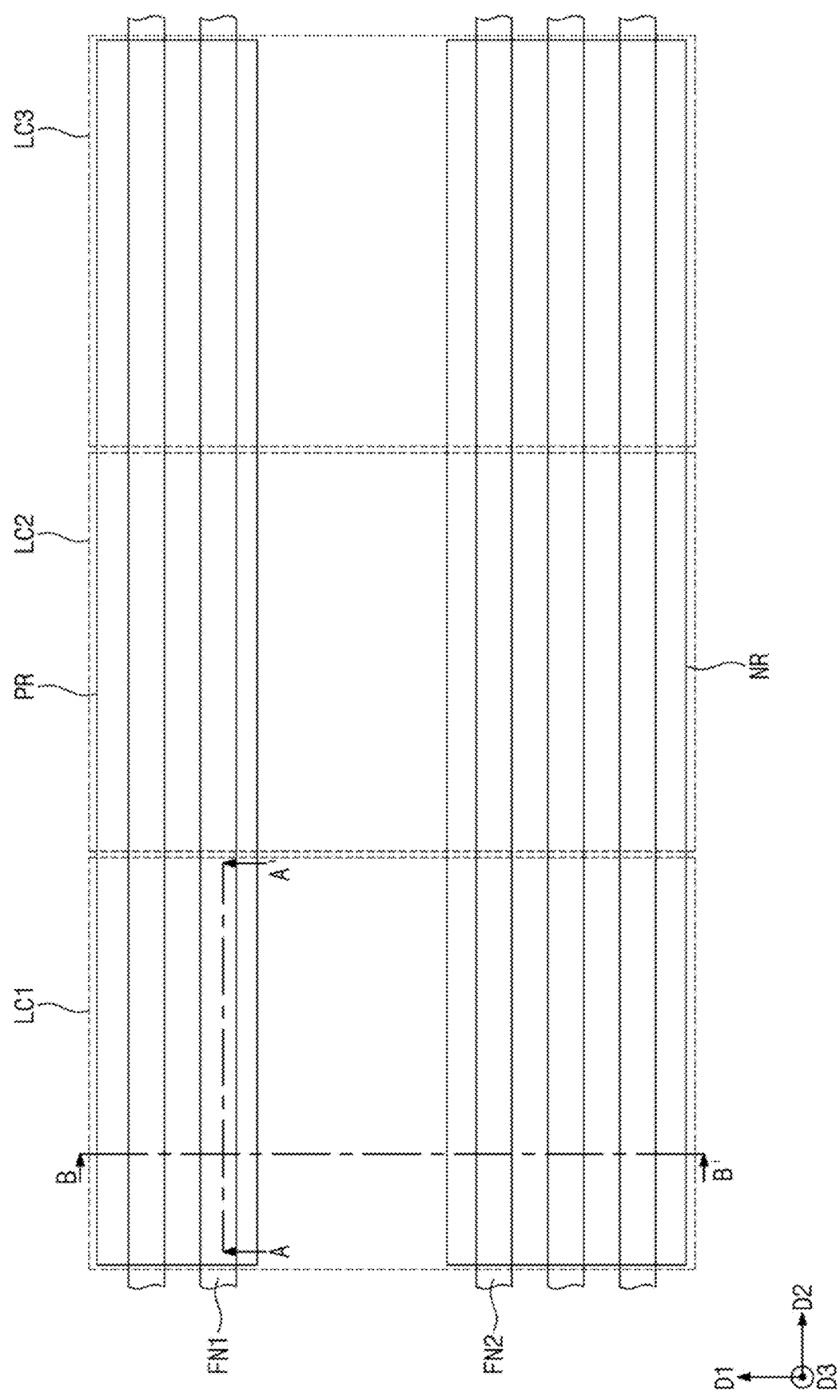
FIGS. 16, 18, and 20 are plan views illustrating a method for manufacturing a semiconductor device, according to an exemplary embodiment of the present inventive concept.
Figure 17A:
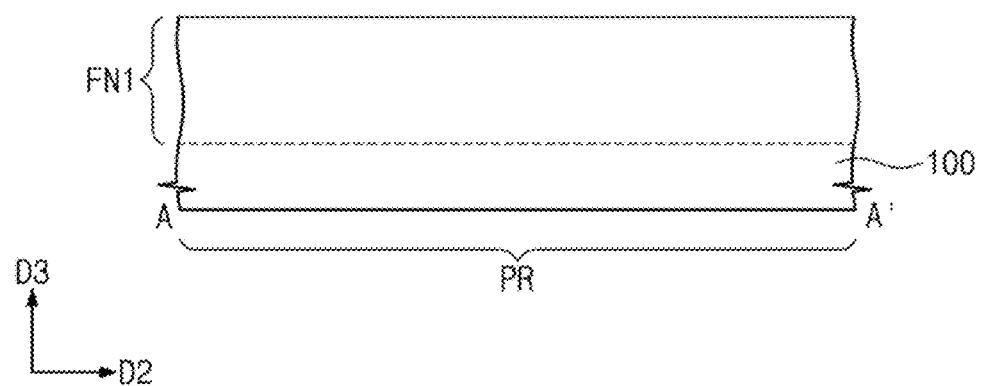
FIGS. 17A, 19A, and 21A are cross-sectional views taken along lines A-A' of FIGS. 16, 18, and 20, respectively.
Figure 17B:
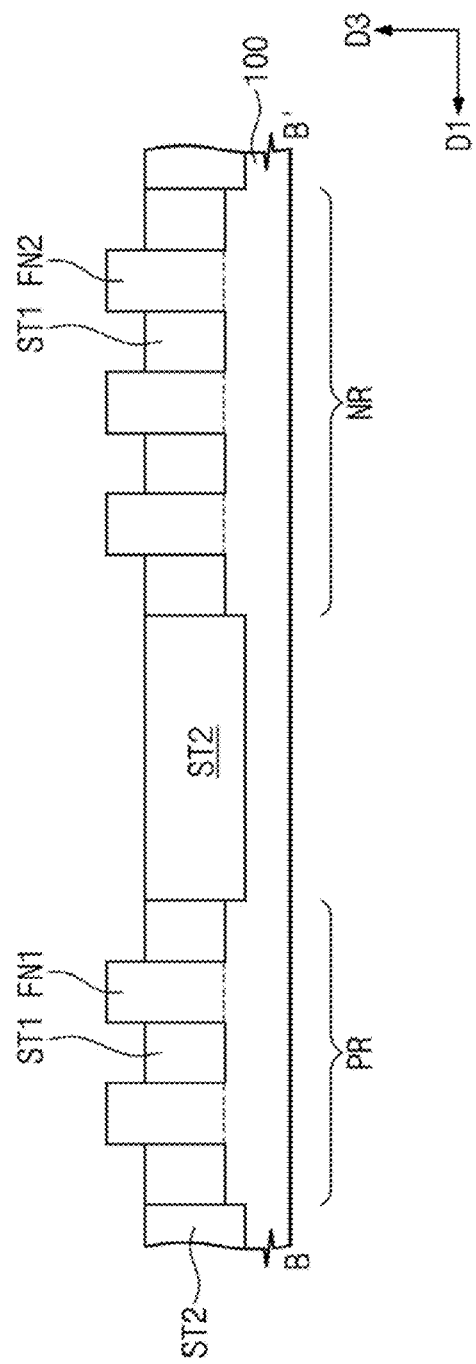
FIGS. 17B, 19B, and 21B are cross-sectional views taken along lines B-B' of FIGS. 16, 18, and 20, respectively.
Figure 18:
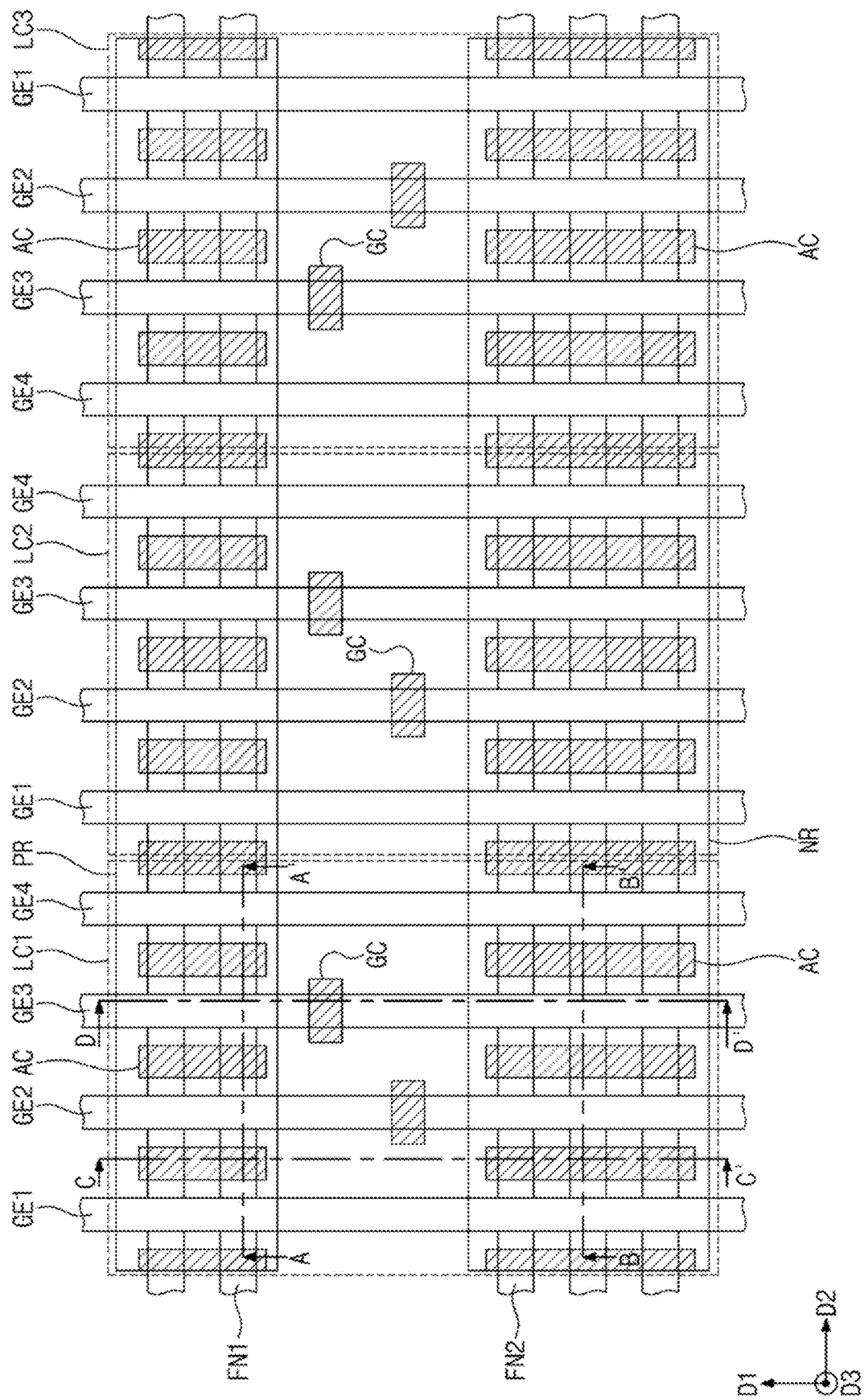
Figure 19A:
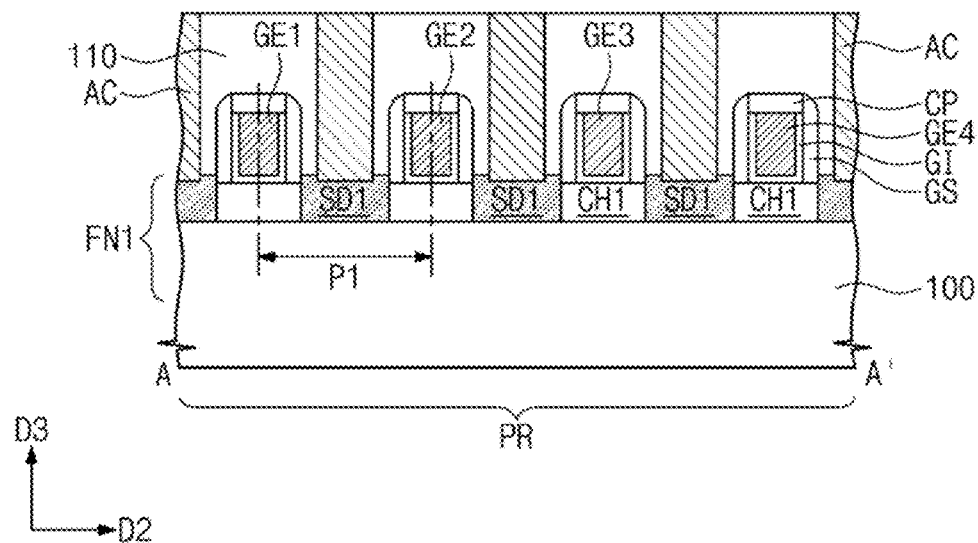
Figure 19B:
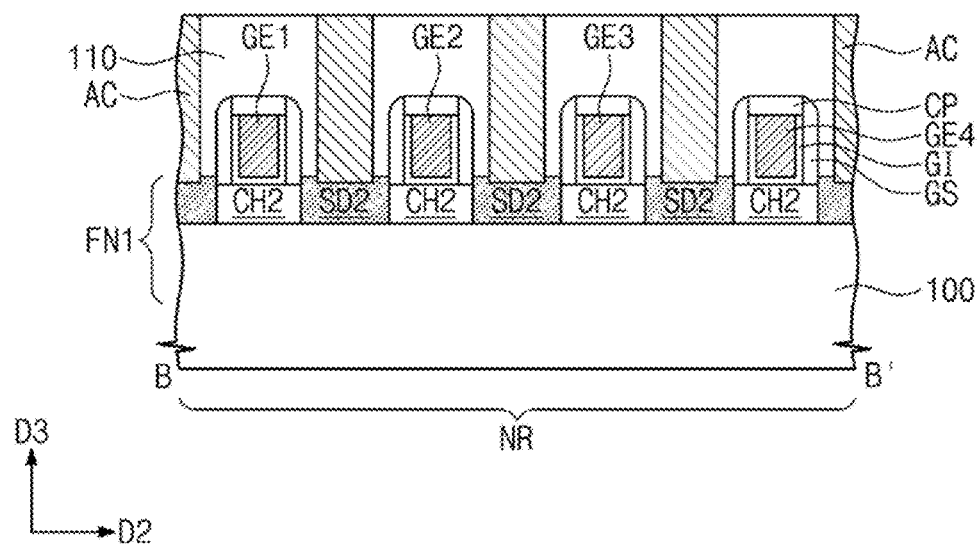
Figure 19C:
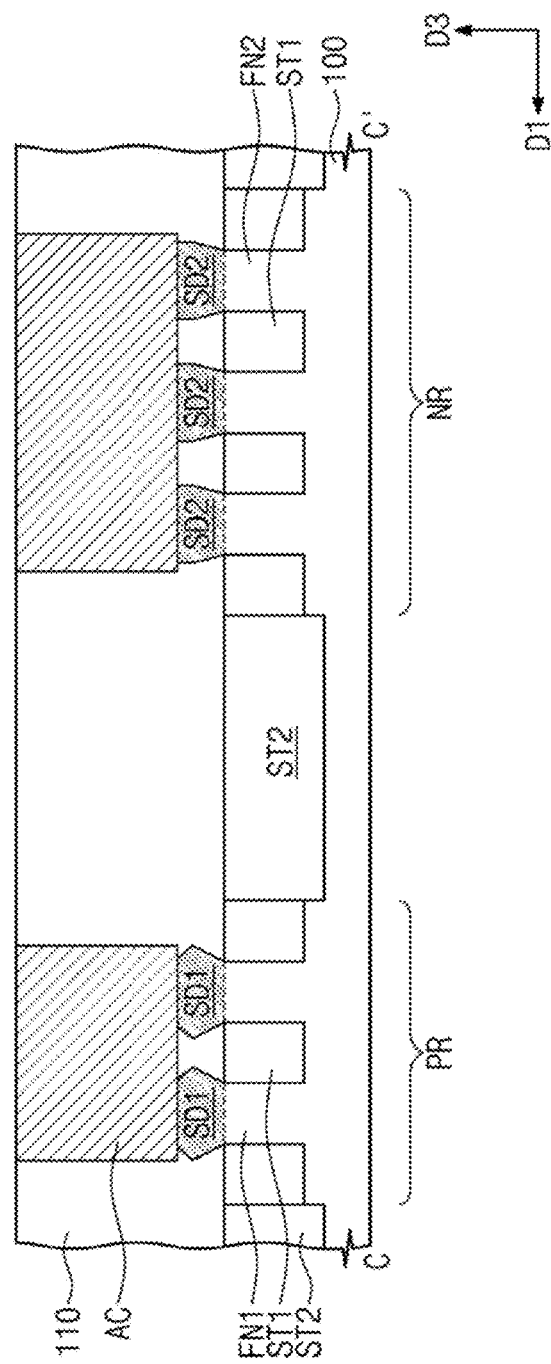
FIGS. 19C and 21C are cross-sectional views taken along lines C-C' of FIGS. 18 and 20, respectively.
Figure 19D:
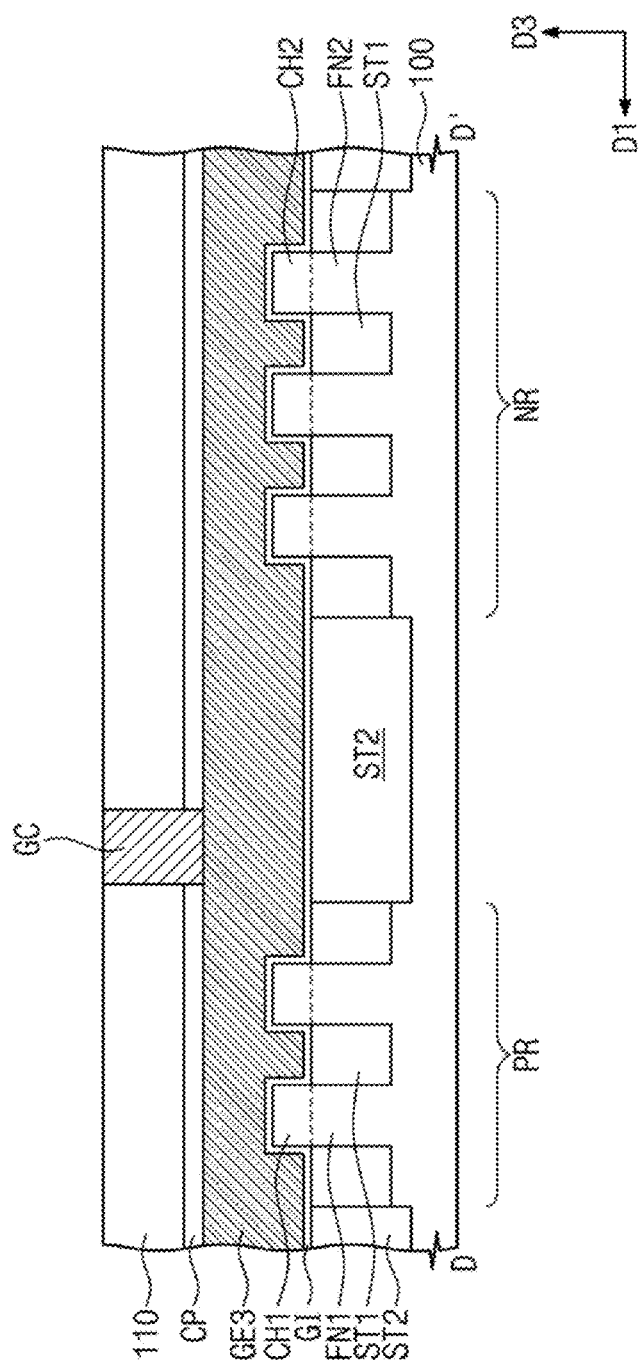
FIGS. 19D and 21D are cross-sectional views taken along lines D-D' of FIGS. 18 and 20, respectively.
Figure 20:
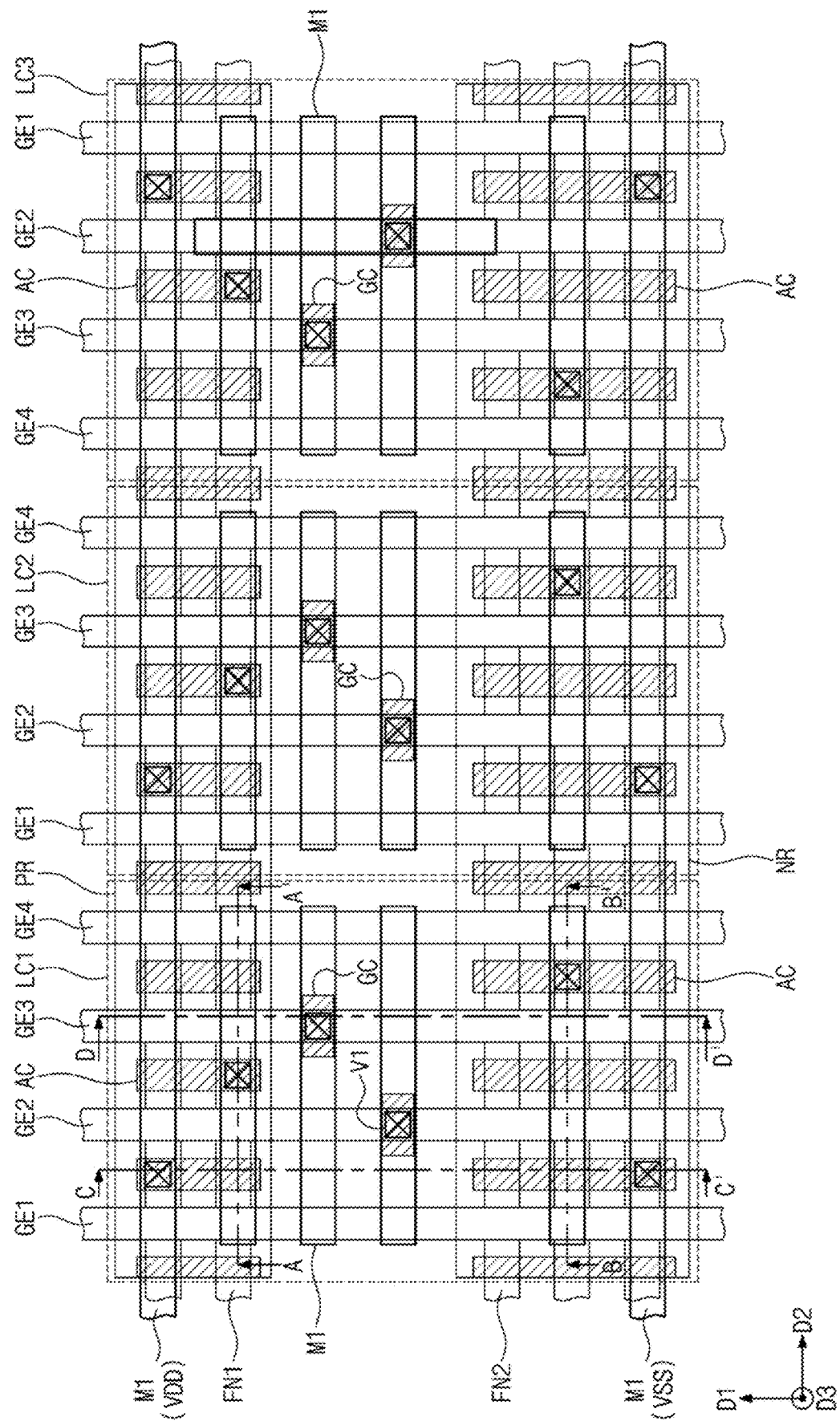
Figure 21A:
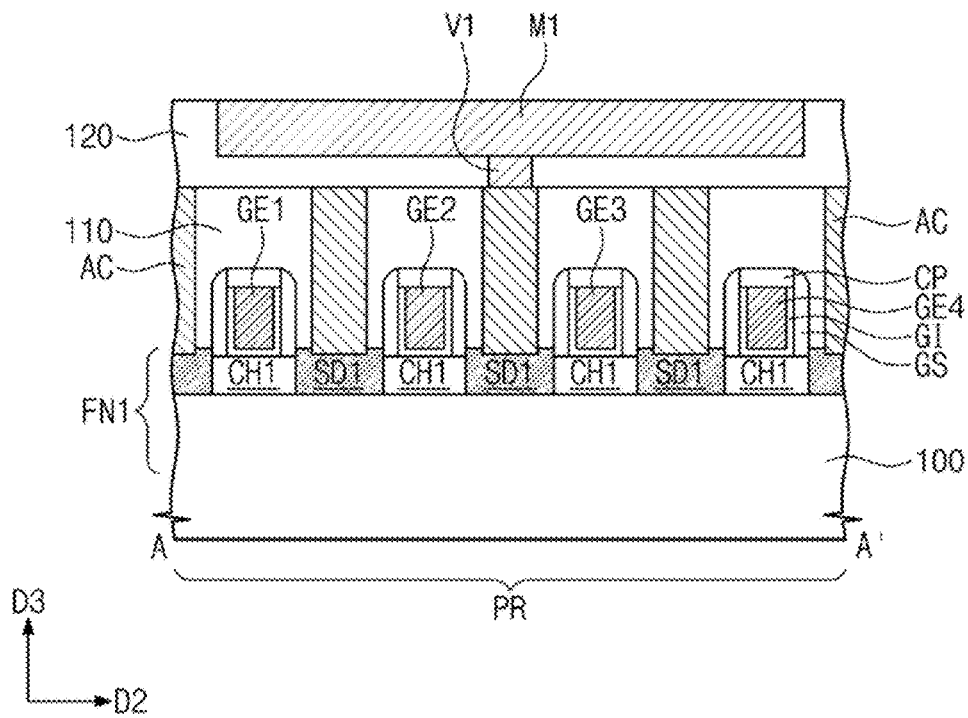
Figure 21B:
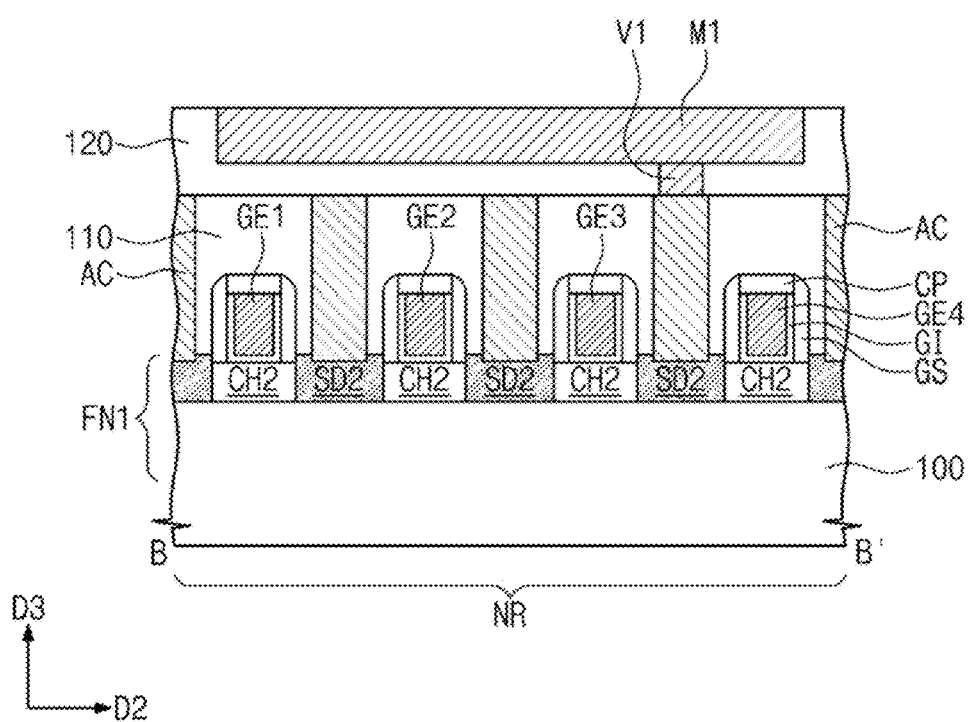
Figure 21C:
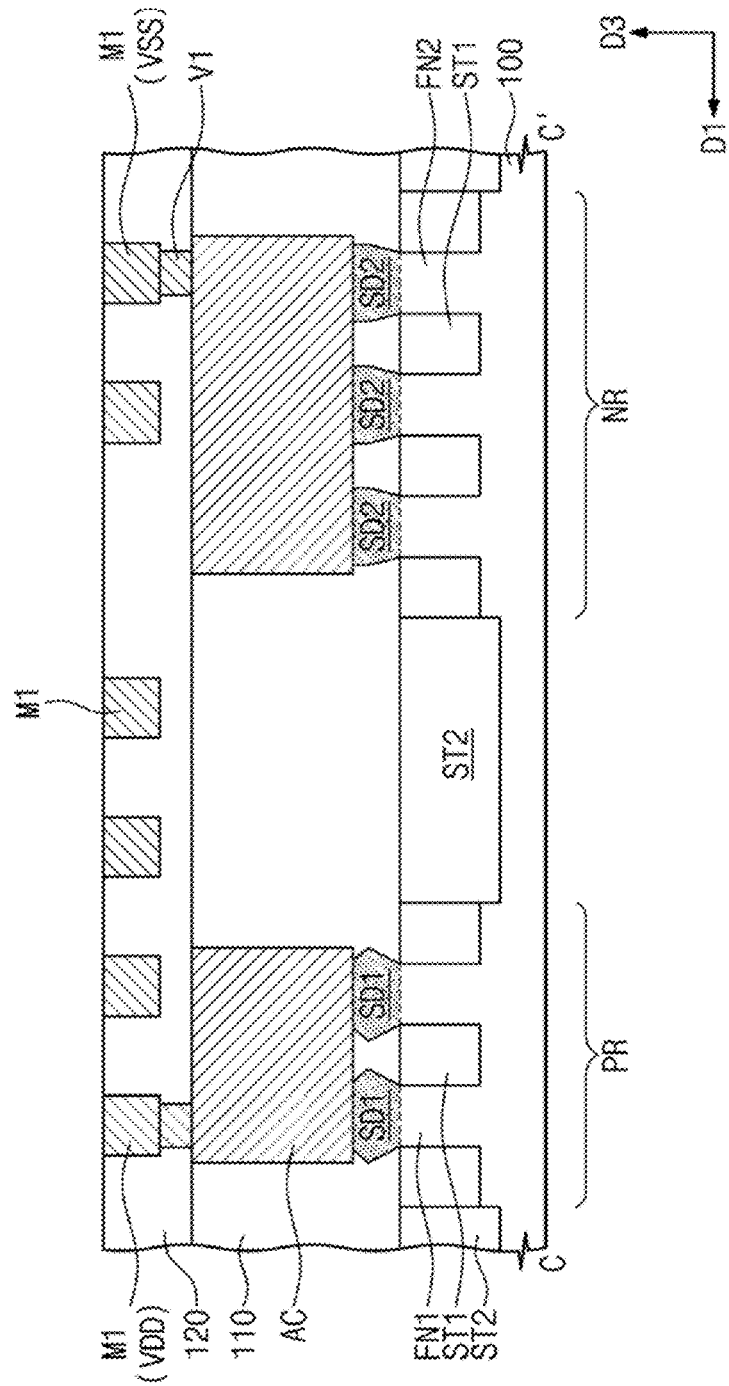
Figure 21D:
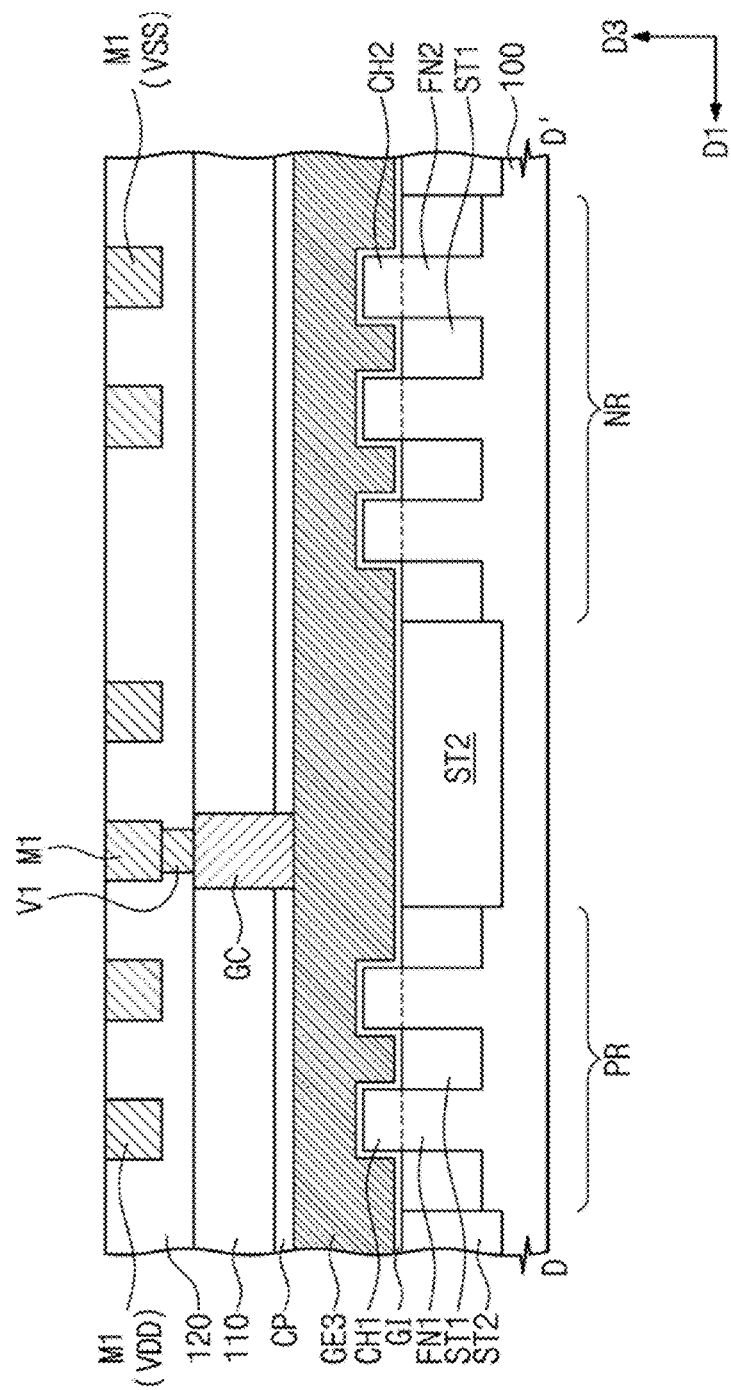

FIGS. 16, 18, and 20 are plan views illustrating a method for manufacturing a semiconductor device, according to an exemplary embodiment of the present inventive concept. FIGS. 17A, 19A, and 21A are cross-sectional views taken along lines A-A' of FIGS. 16, 18, and 20, respectively, and FIGS. 17B, 19B, and 21B are cross-sectional views taken along lines B-B' of FIGS. 16, 18, and 20, respectively. FIGS. 19C and 21C are cross-sectional views taken along lines C-C' of FIGS. 18 and 20, respectively, and FIGS. 19D and 21D are cross-sectional views taken along lines D-D' of FIGS. 18 and 20, respectively. A method for manufacturing a semiconductor device according to an exemplary embodiment of the present inventive concept may include processes of forming patterns on a real substrate by using the designed layout of FIG. 11.

Referring to FIGS. 16, 17A and 17B, the substrate 100 may be provided. For example, the substrate 100 may be a silicon substrate, a germanium substrate, or a silicon-on-insulator (SOI) substrate. An upper portion of the substrate 100 may be patterned to form first and second active patterns FN1 and FN2. First device isolation layers ST1 may be formed in trenches between the first and second active patterns FN1 and FN2. Second device isolation layers ST2 may be formed in the substrate 100 to define the PMOSFET region PR and the NMOSFET region NR.

The first and second device isolation layers ST1 and ST2 may be formed by a shallow-trench isolation (ST1) process. The first and second device isolation layers ST1 and ST2 may be formed using, for example, silicon oxide.

Referring to FIGS. 18 and 19A to 19D, gate electrodes GE1, GE2, GE3 and GE4 extending in the first direction D1 may be formed on the substrate 100 to intersect the first and second active patterns FN1 and FN2. Gate dielectric layers GI may be formed under the gate electrodes GE1, GE2, GE3 and GE4. Gate spacers GS may be formed on both sidewalls of each of the gate electrodes GE1, GE2, GE3 and GE4. Gate capping layers CP may be formed on the gate electrodes GE1, GE2, GE3 and GE4.

As an example, the formation of the gate electrodes GE1, GE2, GE3 and GE4 may include forming sacrificial patterns intersecting the first and second active patterns FN1 and FN2, forming the gate spacers GS on both sidewalls of each of the sacrificial patterns, and replacing the sacrificial patterns with the gate electrodes v.

The gate electrodes GE1, GE2, GE3 and GE4 may include at least one of a conductive metal nitride or a metal material. The gate dielectric layers GI may include a high-k dielectric material of which a dielectric constant is higher than that of silicon oxide. The gate spacers GS may include at least one of SiCN, SiCON, or SiN. The gate capping layers CP may include at least one of SiON, SiCN, SiCON, or SiN.

First source/drain regions SD1 may be formed in upper portions of the first active patterns FN1. Second source/drain regions SD2 may be formed in upper portions of the second active patterns FN2. The first and second source/drain regions SD1 and SD2 may be formed at both sides of each of the gate electrodes GE1, GE2, GE3 and GE4. The first source/drain regions SD1 may be doped with P-type dopants and the second source/drain regions SD2 may be doped with N-type dopants.

As an example, the first and second source/drain regions SD1 and SD2 may include epitaxial patterns formed by a selective epitaxial growth (SEG) process. In an exemplary embodiment of the present inventive concept, portions of the first and second active patterns FN1 and FN2 disposed at both sides of each of the gate electrodes GE1, GE2, GE3 and GE4 may be recessed, and then, the SEG process may be performed on the recessed regions of the first and second active patterns FN1 and FN2 to form the epitaxial patterns.

The first interlayer insulating layer 110 may be formed on substantially an entire top surface of the substrate 100. The first interlayer insulating layer 110 may include a silicon oxide layer and/or a silicon oxynitride layer. Active contacts AC and gate contacts GC may be formed in the first interlayer insulating layer 110. The active contacts AC may be formed on the first and second source/drain regions SD1 and SD2. The active contacts AC may have bar shapes extending in the first direction D1. The gate contacts GC may be formed on corresponding ones of the gate electrodes GE1, GE2, GE3 and GE4. The gate contacts GC may have bar shapes extending in the second direction D2.

Referring again to FIGS. 20 and 21A to 21D, the second interlayer insulating layer 120 may be formed on the first interlayer insulating layer 110. The second interlayer insulating layer 120 may include a silicon oxide layer and/or a silicon oxynitride layer.

First interconnection lines M1 and first vias V1 may be formed in the second interlayer insulating layer 120. The first vias V1 may be formed between the first interconnection lines M1 and the active contacts AC and between the first interconnection lines M1 and the gate contacts GC. Each of the first interconnection lines M1 may have a line or bar shape extending in the second direction D2.

As an example, a first photomask may be generated using the first interconnection line patterns M1a of the layout of FIG. 11 (see, e.g., step S40 of FIG. 2). A photolithography process may be performed using the first photomask to form first interconnection line trenches in the second interlayer insulating layer 120. The first interconnection lines M1 may be formed by filling the first interconnection line trenches with a conductive material (see, e.g., step S50 of FIG. 2).

Referring again to FIGS. 14 and 15A, 15B, 15C, 15D, 15E and 15F, the third interlayer insulating layer 130 may be formed on the second interlayer insulating layer 120. The third interlayer insulating layer 130 may include a silicon oxide layer and/or a silicon oxynitride layer.

Second interconnection lines M2 and second vias V2 may be formed in the third interlayer insulating layer 130. The second vias V2 may be formed between the second interconnection lines M2 and the first interconnection lines M1. Each of the second interconnection lines M2 may have a line or bar shape extending in the first direction D1.

As an example, a second photomask may be generated using the second interconnection line patterns M2a of the layout of FIG. 11 (see, e.g., step S40 of FIG. 2). A photolithography process may be performed using the second photomask to form second interconnection line trenches in the third interlayer insulating layer 130. A third photomask may be generated using the via patterns V2a of the layout of FIG. 11 (see, e.g., step S40 of FIG. 2). A photolithography process may be performed using the third photomask to form vertical holes in the second interconnection line trenches in the third interlayer insulating layer 130. The vertical holes may expose portions of the first interconnection lines M1. The second interconnection lines M2 and the second vias V2 may be formed together (e.g., by a single continuous process) by filling the second interconnection line trenches and the vertical holes with a conductive material (see, e.g., step S50 of FIG. 2). The second interconnection line M2 and the second via V2 connected thereto may be formed as a single unitary body.

Figure 22:
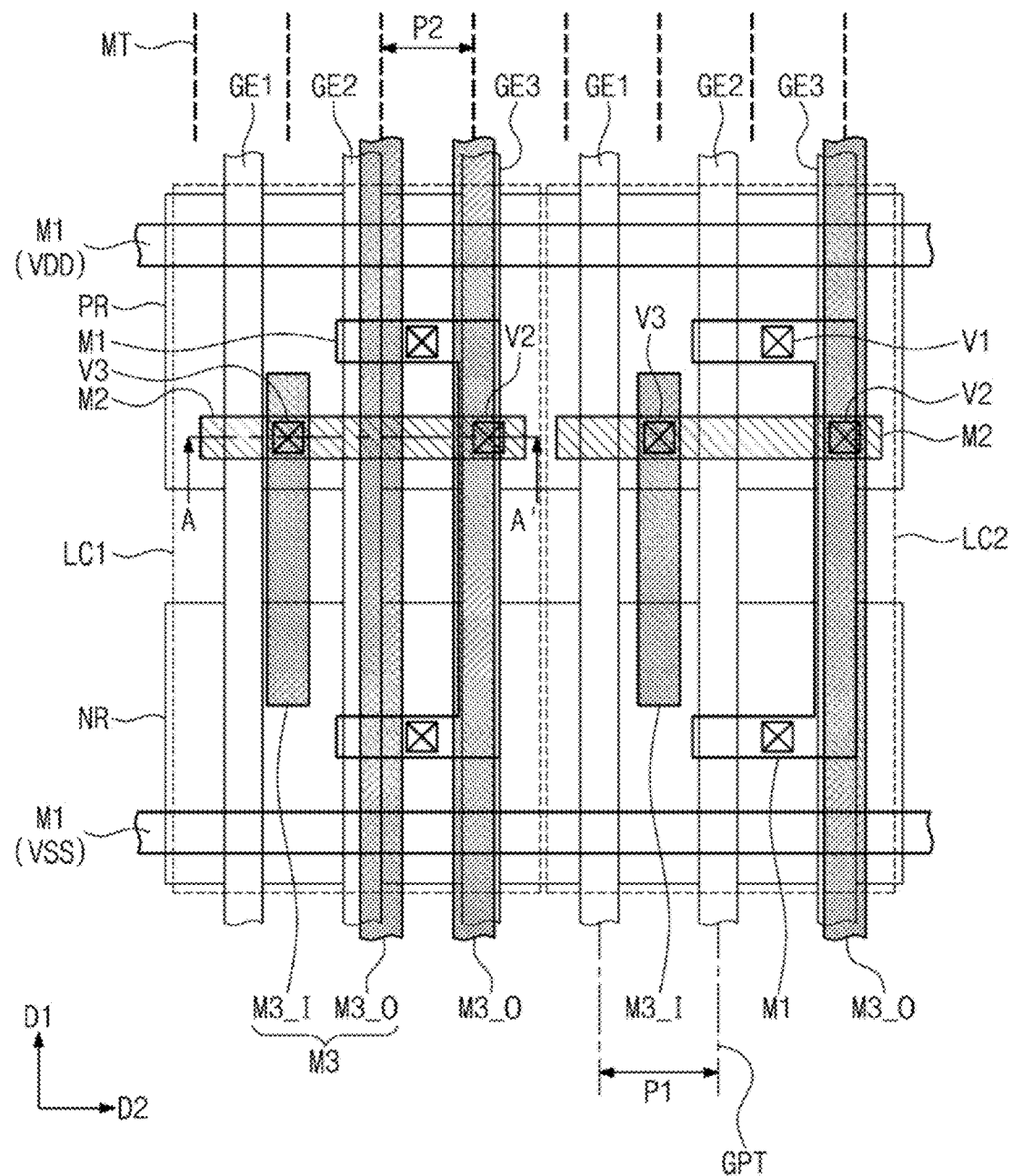
FIG. 22 is a plan view illustrating a semiconductor device according to an exemplary embodiment of the present inventive concept.
Figure 23:
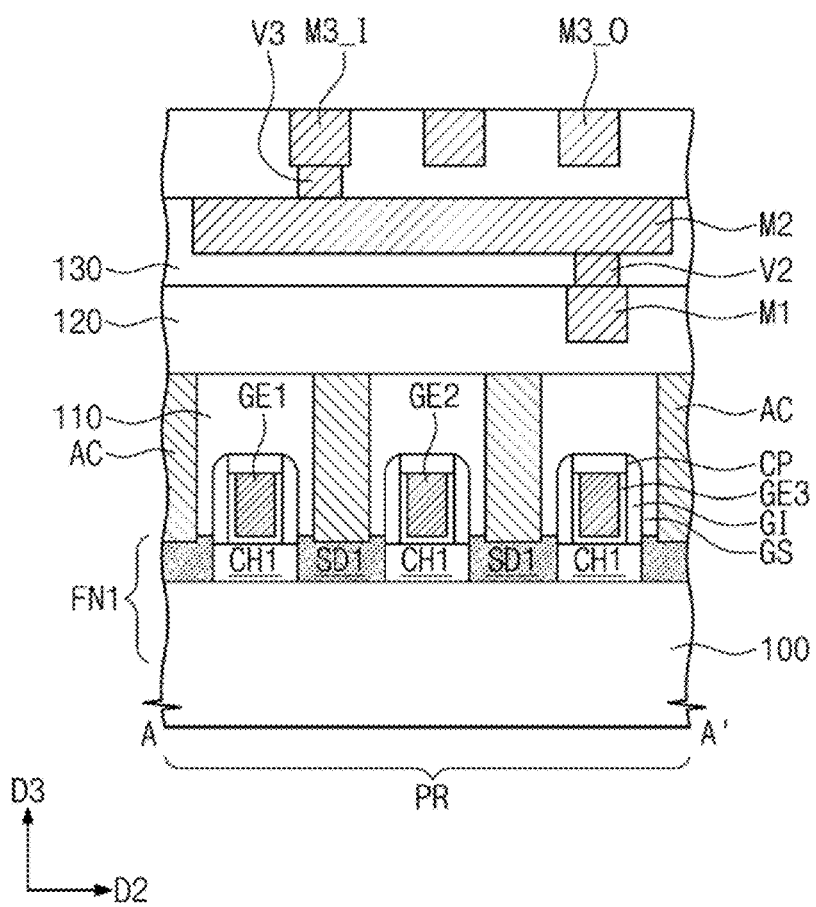
FIG. 23 is a cross-sectional view taken along a line A-A' of FIG. 22.

FIG. 22 is a plan view illustrating a semiconductor device according to an exemplary embodiment of the present inventive concept. FIG. 23 is a cross-sectional view taken along a line A-A' of FIG. 22. In an exemplary embodiment of the present inventive concept, the descriptions to the same technical features as described above with reference to FIGS. 14 and 15A, 15B, 15C, 15D, 15E and 15F may be omitted or mentioned briefly below. Thus, differences from the technical features described above with reference to FIGS. 14 and 15A, 15B, 15C, 15D, 15E and 15F will be focused on below.

Referring to FIGS. 22 and 23, first and second logic cells LC1 and LC2 may be provided. The first and second logic cells LC1 and LC2 may be arranged in a second direction D2. Each of the first and second logic cells LC1 and LC2 may include a logic circuit. In an exemplary embodiment of the present inventive concept, the first and second logic cells LC1 and LC2 may be included in the same logic circuit. As an example, the first and second logic cells LC1 and LC2 may have the same transistor structure and the same internal interconnection line structure.

Gate electrodes GE1, GE2 and GE3 may be provided to intersect a PMOSFET region PR and an NMOSFET region NR of the substrate 100. The minimum pitch between the gate electrodes GE1, GE2 and GE3 may be a first pitch P1. The gate electrodes GE1, GE2 and GE3 may be arranged at substantially equal distances from each other in accordance with the first pitch P1. The gate electrodes GE1, GE2 and GE3 in each of the first and second logic cells LC1 and LC2 may include first, second and third gate electrodes GE1, GE2 and GE3. Thus, each of the first and second logic cells LC1 and LC2 may respectively include first, second and third gate electrodes GE1, GE2 and GE3.

The first interlayer insulating layer 110 may cover the gate electrodes GE1, GE2 and GE3, and second to fourth interlayer insulating layers 120, 130 and 140 may be sequentially stacked on the first interlayer insulating layer 110. A first metal layer may be provided in the second interlayer insulating layer 120, a second metal layer may be provided in the third interlayer insulating layer 130, and a third metal layer may be provided in the fourth interlayer insulating layer 140. The first metal layer in the second interlayer insulating layer 120 may include first interconnection lines M1 and first vias V1. The second metal layer in the third interlayer insulating layer 130 may include second interconnection lines M2 and second vias V2. The third metal layer in the fourth interlayer insulating layer 140 may include third interconnection lines M3_I and M3_O and third vias V3.

At least one of the first interconnection lines M1 may include a portion extending in the first direction D1 and a portion extending in the second direction D2. The first interconnection lines M1 according to an exemplary embodiment of the present inventive concept may extend in the first direction D1 and/or the second direction D2. However, exemplary embodiments of the present inventive concept are not limited thereto.

The second interconnection lines M2 may extend in the second direction D2. The second interconnection lines M2 according to an exemplary embodiment of the present inventive concept may extend in the second direction D2 intersecting an extending direction of the gate electrodes GE1, GE2 and GE3.

Shapes and positions of the logic transistors and the first and second metal layers in the first logic cell LC1 may be substantially the same as shapes and positions of the logic transistors and the first and second metal layers in the second logic cell LC2. This is because the first logic cell LC1 and the second logic cell LC2 may be included in the same logic circuit.

The third interconnection lines M3_I and M3_O may include internal interconnection lines M3_I and routing interconnection lines M3_O. The third interconnection lines M3_I and M3_O may extend in the first direction D1 parallel to the extending direction of the gate electrodes GE1, GE2 and GE3.

The minimum pitch between the third interconnection lines M3_I and M3_O may be a second pitch P2. A distance between central lines of the third interconnection lines M3_I and M3_O adjacent to each other may be n×P2 where "n" is an integral number equal to or greater than 1. The second pitch P2 corresponding to the minimum pitch between the third interconnection lines M3_I and M3_O may be smaller than the first pitch P1 corresponding to the minimum pitch between the gate electrodes GE1, GE2 and GE3.

The internal interconnection line M3_I in each of the first and second logic cells LC1 and LC2 may extend from on the PMOSFET region PR onto the NMOSFET region NR. The internal interconnection line M3_I may electrically connect a PMOSFET to an NMOSFET. As an example, the internal interconnection line M3_I in each of the first and second logic cells LC1 and LC2 may be an interconnection line included in the logic circuit. For example, the internal interconnection line M3_I may be an input node or an output node of the logic circuit.

Even though the first and second logic cells LC1 and LC2 include the same logic circuit, positions of the internal interconnection lines M3_I in the first and second logic cells LC1 and LC2 may be different from each other. A distance by which the internal interconnection line M3_I is offset from the first gate electrode GE1 adjacent thereto in the first logic cell LC1 may be different from a distance by which the internal interconnection line M3_I is offset from the first gate electrode GE1 adjacent thereto in the second logic cell LC2, when viewed in a plan view.

The routing interconnection lines M3_O in each of the first and second logic cells LC1 and LC2 may connect the logic circuit thereof to a logic circuit of another logic cell. As an example, the routing interconnection lines M3_O may be independent of the logic circuits of the first and second logic cells LC1 and LC2. The number and shapes of the routing interconnection lines M3_O of the first logic cell LC1 may be different from the number and shapes of the routing interconnection lines M3_O of the second logic cell LC2.

In the semiconductor device according to an exemplary embodiment of the present inventive concept, the minimum pitch between the interconnection lines may be smaller than the minimum pitch between the gate electrodes. Thus, the pattern density of the interconnection lines in the logic cell may be increased to increase the integration density and accuracy of electrical conductivity of the semiconductor device.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor device comprising:
a first logic cell and a second logic cell on a substrate, wherein a structure of a logic circuit of the first logic cell is the same as a structure of a logic circuit of the second logic cell, wherein each of the first and second logic cells comprises:
a first fin on a PMOSFET region and a second fin on an NMOSFET region;
a gate electrode intersecting the first and second fins and extending in a first direction; and
an internal interconnection line disposed on the gate electrode and extending in the first direction,
wherein the internal interconnection line is an interconnection line included in the logic circuit of each of the first and second logic cells, and
wherein a distance by which an internal interconnection line of the first logic cell is offset from a gate electrode of the first logic cell in a plan view is different from a distance by which a corresponding internal interconnection line of the second logic cell is offset from a corresponding gate electrode of the second logic cell in a plan view.

2. The semiconductor device of claim 1, wherein the internal interconnection line electrically connects a PMOS transistor of the PMOSFET region to an NMOS transistor of the NMOSFET region.

3. The semiconductor device of claim 1, wherein one end of the internal interconnection line is disposed on the PMOSFET region, and
wherein another end of the internal interconnection line is disposed on the NMOSFET region.

4. The semiconductor device of claim 1, wherein a plurality of interconnection line tracks are defined on the first and second logic cells, the plurality of interconnection line tracks extend parallel to each other in the first direction, the plurality of interconnection line tracks are arranged at a first pitch in a second direction intersecting the first direction,
wherein a cell boundary is defined between the first and second logic cells, the cell boundary extending in the first direction,
wherein the internal interconnection line in each of the first and second logic cells is aligned on a corresponding one of the plurality of interconnection line tracks, and
wherein one of the plurality of interconnection line tracks that is closest to the cell boundary is offset from the cell boundary in the second direction.

5. The semiconductor device of claim 4, wherein each of the first and second logic cells further comprises: a routing interconnection line disposed at a same level as the internal interconnection line and aligned on a corresponding one of the plurality of interconnection line tracks.

6. The semiconductor device of claim 4, wherein the gate electrode includes a plurality of gate electrodes in each of the first and second logic cells,
wherein the gate electrodes are arranged at a second pitch in the second direction intersecting the first direction, and
wherein the first pitch is smaller than the second pitch.

7. The semiconductor device of claim 1, wherein each of the first and second logic cells further comprises: a first interconnection line disposed between the gate electrode and the internal interconnection line,
wherein the first interconnection line extends in a second direction intersecting the first direction, and
wherein a placement of the first interconnection line in the first logic cell is substantially the same as a placement of the first interconnection line in the second logic cell.

8. The semiconductor device of claim 1, wherein the gate electrode of the first logic cell and the gate electrode of the second logic cell are respectively included in a same gate electrode of the logic circuits of the first and second logic cells.

9. The semiconductor device of claim 1, wherein each of the first and second logic cells further comprises a device isolation layer covering a sidewall of a lower portion of each of the first and second fins, and
wherein the gate electrode surrounds a top surface and both sidewalls of an upper portion of each of the first and second fins.

10. A semiconductor device comprising:
a first logic cell and a second logic cell on a substrate,
wherein a structure of a logic circuit of the first logic cell is the same as a structure of a logic circuit of the second logic cell,
wherein each of the first and second logic cells comprises:
a first fin on a PMOSFET region and a second fin on an NMOSFET region;
a first gate electrode and a second gate electrode intersecting the first and second fins and extending in a first direction; and
an internal interconnection line disposed on the first and second gate electrodes and extending in the first direction, the internal interconnection line being between the first and second gate electrodes in a plan view,
wherein the internal interconnection line is an interconnection line included in the logic circuit of each of the first and second logic cells,
wherein, in the first logic cell, the internal interconnection line is closer to the first gate electrode than the second gate electrode in a plan view, and
wherein, in the second logic cell, the internal interconnection line is closer to the second gate electrode than the first gate electrode in a plan view.

11. The semiconductor device of claim 10, wherein the internal interconnection line electrically connects a PMOS transistor of the PMOSFET region to an NMOS transistor of the NMOSFET region.

12. The semiconductor device of claim 10, wherein one end of the internal interconnection line is disposed on the PMOSFET region, and
wherein another end of the internal interconnection line is disposed on the NMOSFET region.

13. The semiconductor device of claim 10, wherein a shape of the internal interconnection line of the first logic cell is substantially the same as a shape of the internal interconnection line of the second logic cell.

14. The semiconductor device of claim 10, wherein each of the first and second logic cells further comprises a device isolation layer covering a sidewall of a lower portion of each of the first and second fins, and
wherein each of the first and second gate electrodes surrounds a top surface and both sidewalls of an upper portion of each of the first and second fins.

15. A semiconductor device comprising
a first logic cell and a second logic cell on a substrate,
wherein a structure of a logic circuit of the first logic cell is the same as a structure of a logic circuit of the second logic cell,
wherein a plurality of interconnection line tracks are defined on the first and second logic cells, the plurality of interconnection line tracks extend parallel to each other in a first direction, the plurality of interconnection line tracks are arranged at a first pitch in a second direction intersecting the first direction, wherein a first cell boundary is defined between the first and second logic cells, the first cell boundary extending in the first direction, and a second cell boundary is opposite to the first cell boundary, wherein each of the first and second logic cells comprises:

a first fin on a PMOSFET region and a second fin on an NMOSFET region;

a first gate electrode and a second gate electrode intersecting the first and second fins and extending in the first direction, wherein, of the first and second gate electrodes, the second gate electrode is nearest to the second cell boundary;

a routing interconnection line partially overlapping the second gate electrode; and an internal interconnection line aligned on a corresponding one of the plurality of interconnection line tracks and extending in the first direction, wherein the internal interconnection line is an interconnection line included in the logic circuit of each of the first and second logic cells, and wherein one of the plurality of interconnection line tracks that is closest to the first cell boundary is offset from the first cell boundary in the second direction.

16. The semiconductor device of claim 15, wherein the plurality of interconnection line tracks includes:

a first interconnection line track that is closest to the first cell boundary on the first logic cell; and a second interconnection line track that is closest to the first cell boundary on the second logic cell, wherein a distance between the first interconnection line track and the first cell boundary in a plan view is different from a distance between the second interconnection line track and the first cell boundary in a plan view.

17. The semiconductor device of claim 15, wherein the routing interconnection line is disposed at a same level as the internal interconnection line and is aligned on a corresponding one of the plurality of interconnection line tracks.

18. The semiconductor device of claim 15, wherein the first and second gate electrodes are of a plurality of gate electrodes in each of the first and second logic cells, wherein the plurality of gate electrodes are arranged at a second pitch in the second direction, and wherein the first pitch is smaller than the second pitch.

19. The semiconductor device of claim 15, wherein a distance by which the internal interconnection line of the first logic cell is offset from the first gate electrode of the first logic cell in a plan view is different from a distance by which the corresponding internal interconnection line of the second logic cell is offset from a corresponding gate electrode of the second logic cell in a plan view.

20. The semiconductor device of claim 15, wherein each of the first and second logic cells further comprises a device isolation layer covering a sidewall of a lower portion of each of the first and second fins, and wherein the first gate electrode surrounds a top surface and both sidewalk of an upper portion of each of the first and second fins.

* * * * *